US009324912B2

(12) United States Patent
Udagawa

(10) Patent No.: US 9,324,912 B2
(45) Date of Patent: Apr. 26, 2016

(54) GROUP III NITRIDE SEMICONDUCTOR LIGHT-EMITTING ELEMENT AND METHOD FOR PRODUCING SAME

(75) Inventors: Takashi Udagawa, Chichibu (JP); Hiroshi Udagawa, legal representative, Yokohama (JP)

(73) Assignee: TOYODA GOSEI CO., LTD., Aichi-ken (JP)

( * ) Notice: Subject to any disclaimer, the term of this patent is extended or adjusted under 35 U.S.C. 154(b) by 19 days.

(21) Appl. No.: 14/118,441

(22) PCT Filed: May 16, 2012

(86) PCT No.: PCT/JP2012/062539
§ 371 (c)(1),
(2), (4) Date: Nov. 18, 2013

(87) PCT Pub. No.: WO2012/157683
PCT Pub. Date: Nov. 22, 2012

(65) Prior Publication Data
US 2014/0183580 A1    Jul. 3, 2014

(30) Foreign Application Priority Data

May 19, 2011    (JP) .................................. 2011-112295

(51) Int. Cl.
*H01L 33/00* (2010.01)
*H01L 33/32* (2010.01)
*H01L 21/02* (2006.01)

(52) U.S. Cl.
CPC ............ *H01L 33/32* (2013.01); *H01L 21/0237* (2013.01); *H01L 21/0254* (2013.01);
(Continued)

(58) Field of Classification Search
CPC ... H01L 33/325; H01L 33/32; H01L 33/0075; H01L 33/007; H01L 21/0237; H01L 21/02381; H01L 21/02458; H01L 21/0254; H01L 21/02576; H01L 21/02579; H01L 21/0262
USPC .......................................................... 257/94
See application file for complete search history.

(56) References Cited

U.S. PATENT DOCUMENTS 5,751,013 A    5/1998 Kidoguchi et al.
5,895,225 A    4/1999 Kidoguchi et al.
(Continued)

FOREIGN PATENT DOCUMENTS

JP        55-3834 B2    1/1980
JP        09-167857    * 12/1995    .............. H01L 33/00
(Continued)

OTHER PUBLICATIONS

International Search Report of PCT/JP2012/062539 dated Aug. 7, 2012, English Translation.
(Continued)

*Primary Examiner* — Minh-Loan Tran
*Assistant Examiner* — Farid Khan
(74) *Attorney, Agent, or Firm* — Sughrue Mion, PLLC

(57) ABSTRACT

A group III nitride semiconductor light-emitting element having a pn junction hetero structure composed of: an n-type aluminum gallium indium nitride layer; a light-emitting layer disposed contacting the n-type aluminum gallium indium nitride layer and including a gallium indium nitride layer containing crystals having a larger lattice constant than the n-type aluminum gallium indium nitride layer; and a p-type aluminum gallium indium nitride layer provided on the light-emitting layer. Further, the relative atomic concentrations of donor impurities at either interface of the light-emitting layer and within respective layers of the light-emitting element are specified herein.

12 Claims, 9 Drawing Sheets

(52) U.S. Cl.
CPC ...... *H01L21/0262* (2013.01); *H01L 21/02381* (2013.01); *H01L 21/02458* (2013.01); *H01L 21/02576* (2013.01); *H01L 21/02579* (2013.01); *H01L 33/0075* (2013.01); *H01L 33/325* (2013.01); *H01L 33/007* (2013.01)

(56) References Cited

U.S. PATENT DOCUMENTS

| | | | |
|---|---|---|---|
| 6,133,058 | A | 10/2000 | Kidoguchi et al. |
| 6,136,626 | A * | 10/2000 | Kidoguchi et al. ............ 438/38 |
| 6,489,636 | B1 | 12/2002 | Goetz et al. |
| 6,541,797 | B1 * | 4/2003 | Udagawa ....................... 257/94 |
| 2002/0171091 | A1 * | 11/2002 | Goetz et al. ................... 257/103 |
| 2002/0187356 | A1 * | 12/2002 | Weeks et al. .................. 428/446 |
| 2009/0045438 | A1 * | 2/2009 | Inoue et al. .................... 257/192 |
| 2011/0064103 | A1 * | 3/2011 | Ohta et al. .................. 372/45.01 |
| 2011/0284890 | A1 * | 11/2011 | Kim et al. ....................... 257/94 |

FOREIGN PATENT DOCUMENTS

| | | |
|---|---|---|
| JP | 2576819 B1 | 1/1997 |
| JP | 09-167857 A | 6/1997 |
| JP | 10-022525 A | 1/1998 |
| JP | 2002-314129 A | 10/2002 |
| JP | 2003-249664 A | 9/2003 |
| JP | 2004-047867 A | 2/2004 |
| JP | 3500762 B2 | 2/2004 |
| JP | 2005-056973 A | 3/2005 |
| JP | 2006-294706 A | 10/2006 |
| JP | 3874779 B2 | 1/2007 |
| WO | 96/03776 A1 | 2/1996 |

OTHER PUBLICATIONS

Takahashi Kiyoshi et al., "Waido Gappu Handoutai Hikari/Denshi Debaisu (Wide Gap Semiconductor Optical/Electrical Device)", 1st edition, 1st printing, Mar. 31, 2006, pp. 133-139.

Akasaki Isamu et al. "Sangozoku Kagoubutsu Handoutai (Group III-V Compound Semiconductor)", 1st edition, May 20, 1994, pp. 148-149.

Hashiguchi Ryukichi et al., "Hakumaku Hyoumen Genshou (Thin Film/Surface Phenomenon)", 4th edition, Dec. 15, 1972, pp. 10-15.

C.W. Bunn et al."Kagaku Kesshougaku, 1st edition", Jun. 15, 1970, pp. 114-119.

* cited by examiner

GROUP III NITRIDE SEMICONDUCTOR LIGHT-EMITTING ELEMENT AND METHOD FOR PRODUCING SAME

CROSS REFERENCE TO RELATED APPLICATIONS

This is a National Stage of International Application No. PCT/JP2012/062539 filed May 16, 2012, claiming priority based on Japanese Patent Application No. 2011-112295 filed May 19, 2011, the contents of all of which are incorporated herein by reference in their entirety.

TECHNICAL FIELD

The present invention relates to a group III nitride semiconductor light-emitting element or the like including a light-emitting layer composed of gallium indium nitride, and in particular, relates to a group III nitride semiconductor light-emitting diode (abbreviation: LED) or the like, which emits short wavelength light in an ultraviolet wavelength band or near ultraviolet wavelength band.

BACKGROUND ART

Conventionally, a group III nitride semiconductor containing a group III element such as aluminum (chemical symbol: Al), gallium (chemical symbol: Ga), indium (chemical symbol: In) or the like, such as aluminum nitride (AlN), gallium nitride (GaN), gallium indium nitride (compositional formula: $Ga_X In_{1-X} N$, $0 \leq X < 1$) or the like as a constituent element has been used to configure a group III nitride semiconductor light-emitting element, such as a light-emitting diode (LED) or a laser diode (abbreviation: LD) (refer to Patent Document 1).

For example, in an LED, a gallium indium nitride layer is utilized as a light-emitting layer for emitting visible light of dark green color or blue color (refer to Patent Document 1). Moreover, for example, it is indicated that a $Ga_{0.4}In_{0.6}N$ layer, in which zinc (chemical symbol: Zn) is added (doping is performed) and indium is large in composition, is useful as a material for emitting red light (refer to Patent Document 1). Further, a gallium indium nitride layer, in which indium is small in composition, is used as a light-emitting layer for emitting ultraviolet light (refer to Patent Document 2).

As the conventional visible light LED or the ultraviolet light LED is viewed in terms of a laminated structure, a double hetero (abbreviation: DH) structure of pn junction type is common, in which, for example, a light-emitting layer constituted by an n-type gallium indium nitride layer is arranged on an n-type cladding layer composed of gallium nitride, and further, for example, a p-type cladding layer composed of an aluminum gallium nitride (compositional formula: $Al_\delta Ga_\epsilon N$, $0 \leq \delta \leq 1$, $0 \leq \epsilon \leq 1$, $\delta + \epsilon = 1$) layer is laminated thereon (refer to Non-Patent Document 1).

In the gallium indium nitride layer used for a light-emitting layer of an LED having such a structure, impurities are intentionally added, that is, a so-called doping is carried out in some cases for adjusting conduction resistance of a current that drives the LED. As n-type impurities in the group III nitride semiconductor, silicon (chemical symbol: Si), germanium (chemical symbol: Ge), tellurium (chemical symbol: Te) and selenium (chemical symbol: Se) are exemplified (refer to paragraph [0008] in Patent Document 3). Germanium is also used as a dopant in manufacturing a layered substance constituted by the group III nitride semiconductors having different atomic concentrations (refer to Patent Document 4).

In addition to germanium, in Patent Document 5, sulfur (chemical symbol: S) is described as the n-type impurity (refer to paragraph [0022] in Patent Document 5).

CITATION LIST

Patent Literature

Patent Document 1: Japanese Examined Patent Application Publication No. 55-3834
Patent Document 2: Japanese Patent Application Laid-Open Publication No. 2003-249664
Patent Document 3: Japanese Patent No. 2576819
Patent Document 4: Japanese Patent No. 3874779
Patent Document 5: Japanese Patent No. 3500762

Non Patent Literature

Non-Patent Document 1: Takahashi Kiyoshi (supervise), Hasegawa Fumio, Yoshikawa Akihiko (write and edit) "Waido Gappu Handoutai Hikari/Denshi Debaisu (Wide Gap Semiconductor Optical/Electrical Device)" Mar. 31, 2006, published by Morikita Publishing Co., Ltd., $1^{st}$ edition, $1^{st}$ printing, pp. 133-139)

SUMMARY OF INVENTION

Technical Problem

Here, lattice constants of the group III nitride semiconductor materials constituting the above-described double hetero (DH) structure will be compared. An a-axis of gallium nitride of a hexagonal wurtzite structure is 0.318 nm (unit of length) (Akasaki Isamu (write and edit) "Sangozoku Kagoubutsu Handoutai (Group III-V Compound Semiconductor)" May 20, 1994, published by Baifukan Co., Ltd., $1^{st}$ edition, p. 148). On the other hand, an a-axis of hexagonal indium nitride is longer than that of the gallium nitride by 0.035 nm, and is 0.353 nm. An a-axis of gallium indium nitride (compositional formula: $Ga_X In_{1-X} N$, $0 \leq X < 1$) has a value in between gallium nitride and indium nitride, and difference with an a-axis of aluminum nitride (a-axis=0.311 nm) exceeds 0.007 nm at minimum, and reaches 0.042 nm at maximum.

In this manner, if there is a great difference in the lattice constants among the group III nitride semiconductor materials, the following problem occurs in a case where these are laminated to constitute the DH structure of the pn junction type. For example, on an n-type gallium nitride layer, a gallium indium nitride layer containing crystals having larger lattice constant is laminated, incorporation of indium is not accelerated within a region of a predetermined thickness from a mating surface between the both layers toward the inside of the gallium indium nitride layer. For this reason, there occurs a problem that a gallium indium nitride layer having indium composition smaller than a preset numerical value is formed. The smaller the indium composition, the larger the forbidden band width of the gallium indium nitride; accordingly, wavelength of emitted light becomes short (refer to the above-described Patent Document 1).

It is considered that a phenomenon of pseudomorphism assuming that "in an initial stage of growth of a gallium indium nitride layer, the growth is performed while a lattice constant is inherited from a base layer thereof" (Hashiguchi Ryukichi, Chikazumi Soshin (edit) "Hakumaku Hyoumen Genshou (Thin Film/Surface Phenomenon)" December 15, Showa 47 (1972), published by Asakura Publishing Co., Ltd., $4^{th}$ edition, pp. 11-14) is a cause of the above-described phenomenon. Such a phenomenon, in which incorporation or admixture of indium is inhibited, is remarkably acknowledged, for example, when a gallium indium nitride layer that emits ultraviolet light or near-ultraviolet light with short light-emission wavelength is grown on a gallium nitride base layer because of small indium composition.

As the growth of the gallium indium nitride layer proceeds and the layer thickness is increased, effect of the pseudomorphism is diminished, and the indium composition within the layer is gradually increased. However, this means that, in the vicinity of a mating surface with a cladding layer composed of n-type gallium nitride, a region having a smaller forbidden band width is formed on a region in a deep portion of a light-emitting layer where a forbidden band width is large.

The short wavelength light, such as ultraviolet light or near-ultraviolet light, generated from a deep portion in the light-emitting layer in the vicinity of the mating surface with the cladding layer composed of the n-type gallium nitride is absorbed by a light-emitting layer that is formed upwardly with higher indium composition and smaller forbidden band width. In other words, this means a laminated structure of the light-emitting layer that is not suitable to efficiently extract light to the outside.

An object of the present invention is to solve a problem that, when a light-emitting layer composed of gallium indium nitride having a lattice constant of a crystal lattice larger than that of gallium nitride is provided on a base layer, such as a cladding layer composed of, among group III nitride semiconductor materials, gallium nitride or the like, which has relatively small lattice constant of a crystal lattice, incorporation of indium into the light-emitting layer is not accelerated and it is difficult to obtain the light-emitting layer having indium composition with a preset numerical value due to difference in the lattice constant among the group III nitride semiconductor materials each constituting each layer.

Solution to Problem

The present invention is an inventive idea generated to solve the problems accompanied by the above-described conventional techniques, and discloses a technique to provide a group III nitride semiconductor light-emitting element that includes, for example, on a gallium nitride layer, a gallium indium nitride layer in which incorporation of indium in the vicinity of a mating surface with the gallium nitride layer is accelerated as a light-emitting layer, and in particular, to provide a light-emitting layer having a configuration capable of efficiently extracting short wavelength light emission, such as ultraviolet light or the like, to the outside.

Thus, according to the present invention, there is provided a group III nitride semiconductor light-emitting element having a pn junction hetero structure, including: an n-type aluminum gallium indium nitride layer; a light-emitting layer configured with a gallium indium nitride layer that is arranged in contact with the n-type aluminum gallium indium nitride layer and contains a crystal having a lattice constant larger than that of the n-type aluminum gallium indium nitride layer; and a p-type aluminum gallium indium nitride layer that is provided on the light-emitting layer, wherein an atomic concentration of a donor impurity existing in the n-type aluminum gallium indium nitride layer and composed of an element having an atomic radius smaller than that of indium is lower at an interface between the n-type aluminum gallium indium nitride layer and the light-emitting layer than in an inside of the n-type aluminum gallium indium nitride layer, and an atomic concentration of the donor impurity in the light-emitting layer is higher at an interface between the light-emitting layer and the p-type aluminum gallium indium nitride layer than at the interface between the light-emitting layer and the n-type aluminum gallium indium nitride layer.

In the group III nitride semiconductor light-emitting element, it is preferable that the light-emitting layer is composed of a gallium indium nitride in which the atomic concentration of the donor impurity is increased from the n-type aluminum gallium indium nitride layer toward the p-type aluminum gallium indium nitride layer.

It is preferable that indium composition in the light-emitting layer is lower at the interface between the p-type aluminum gallium indium nitride layer and the light-emitting layer than at the interface between the n-type aluminum gallium indium nitride layer and the light-emitting layer.

It is preferable that a junction region with the n-type aluminum gallium indium nitride layer is an undoped region where the donor impurity is not added, the junction region existing inside the light-emitting layer.

It is preferable that the n-type aluminum gallium indium nitride layer is provided on a buffer layer deposited on a substrate that has no lattice matching with aluminum gallium indium nitride, and the buffer layer has a duplex structure of an aluminum (Al) thin film layer and an aluminum gallium nitride layer that is provided on the thin film layer and provides a gradient to aluminum composition.

It is preferable that the light-emitting layer is configured with a gallium indium nitride layer that emits light having continuous wavelength with a width of not less than 10 nm.

It is preferable that the light-emitting layer is configured with the gallium indium nitride layer that emits light having continuous wavelength within a range of not less than 360 nm and not more than 420 nm.

Next, according to the present invention, there is provided a method for producing a group III nitride semiconductor light-emitting element having a pn junction hetero structure, wherein the group III nitride semiconductor light-emitting element includes: an n-type aluminum gallium indium nitride layer; a light-emitting layer configured with a gallium indium nitride layer that is arranged in contact with the n-type aluminum gallium indium nitride layer and contains crystal having a lattice constant larger than that of the n-type aluminum gallium indium nitride layer; and a p-type aluminum gallium indium nitride layer that is provided on the light-emitting layer, wherein an atomic concentration of a donor impurity existing in the n-type aluminum gallium indium nitride layer and composed of an element having an atomic radius smaller than that of indium is lower at an interface between the n-type aluminum gallium indium nitride layer and the light-emitting layer than in an inside of the n-type aluminum gallium indium nitride layer, and an atomic concentration of the donor impurity in the light-emitting layer is higher at an interface between the light-emitting layer and the p-type aluminum gallium indium nitride layer than at the interface between the light-emitting layer and the n-type aluminum gallium indium nitride layer, the method including: in forming the light-emitting layer, increasing the atomic concentration of the donor impurity to be added to an inside of the light-emitting layer with passage of time.

In the method for producing a group III nitride semiconductor light-emitting element, it is preferable that the light-emitting layer is formed by, while maintaining supply amounts of gallium (Ga) and indium (In) to a formation environment constant, increasing the atomic concentration of the donor impurity with passage of time.

It is preferable that the light-emitting layer is formed by, while maintaining a supply amount of gallium (Ga) to a formation environment constant, reducing a supply amount of indium (In) with passage of time. It is preferable that after a region in the light-emitting layer which joins with the n-type aluminum gallium indium nitride layer is formed as an undoped region where the donor impurity is not added, the light-emitting layer is formed while increasing the atomic concentration of the donor impurity to be added to an inside of the light-emitting layer with passage of time.

Advantageous Effects of Invention

According to the present invention, a group III nitride semiconductor light-emitting element that includes, on a gallium nitride layer, a gallium indium nitride layer in which incorporation of indium in the vicinity of a mating surface with the gallium nitride layer is accelerated as a light-emitting layer is obtained.

That is, an impurity composed of an element having an atomic radius smaller than that of indium has property to reduce size of a crystal lattice. For this reason, if concentration of donor impurities contained in the gallium indium nitride layer, which are composed of elements having atomic radius smaller than that of indium, is decreased, reduction of the crystal lattice is suppressed. Then, incorporation of indium into the crystals is accelerated, and thereby the gallium indium nitride layer having large indium composition is obtained.

Accordingly, there is an advantage that, when, on an n-type aluminum gallium indium nitride (compositional formula: $Al_\alpha Ga_\beta In_\gamma N$, $0 \leq \alpha \leq 1$, $0 \leq \beta \leq 1$, $0 \leq \gamma < 1$, $\alpha+\beta+\gamma=1$) layer, a gallium indium nitride (compositional formula: $Ga_X In_{1-X} N$, $0 \leq X < 1$) layer having a lattice constant larger than that of the group III nitride semiconductor materials constituting the n-type aluminum gallium indium nitride layer and indium composition reducing in the direction of the layer thickness is provided, the gallium indium nitride layer having large indium composition can be laminated on the n-type aluminum gallium indium nitride layer by providing concentration gradient so that an atomic concentration of donor impurities having atomic radius smaller than that of indium increases in the direction of the layer thickness.

Moreover, on a surface of the n-type aluminum gallium indium nitride layer, on which the gallium indium nitride layer is provided, by making the atomic concentration of the donor impurities having atomic radius smaller than that of indium lower than that in the inside of the layer, it is possible to obtain an effect of suppressing reduction of the crystal lattice in a surface region of the layer.

In addition, when the gallium indium nitride layer is laminated on the layer, it is possible to obtain an effect of suppressing reduction in incorporation rate of indium owing to diffusion of the donor impurities into the inside of the gallium indium nitride layer. Consequently, it becomes possible to stably arrange the gallium indium nitride layer having large indium composition on the n-type aluminum gallium indium nitride layer. As a result, a group III nitride semiconductor light-emitting element capable of efficiently extracting light emission to the outside is obtained.

In particular, according to the present invention, by continuously increasing concentration of donor impurities having atomic radius smaller than that of indium toward a p-type aluminum gallium indium nitride (compositional formula: $Al_\delta Ga_\epsilon In_\zeta N$, $0 \leq \delta \leq 1$, $0 \leq \epsilon \leq 1$, $0 \leq \zeta < 1$, $\delta+\epsilon+\zeta=1$) layer, a gallium indium nitride layer in which indium composition decreases toward the p-type aluminum gallium indium nitride layer in response to the change in concentration is obtained.

Consequently, in a case of an LED of p-side up, a forbidden band width is sequentially increased in a direction of light emission extraction, and thereby, for example, a group III nitride semiconductor light-emitting element that outputs continuous spectrum in an ultraviolet wavelength band is obtained.

Moreover, according to the present invention, by continuously increasing concentration of donor impurities having atomic radius smaller than that of indium toward the p-type aluminum gallium indium nitride layer, a lattice mismatch with the p-type aluminum gallium indium nitride layer having a lattice constant smaller than that of the gallium indium nitride layer is relieved.

For this reason, by using a gallium indium nitride layer as the light-emitting layer, in which concentration of donor impurities is distributed to continuously increase toward the p-type aluminum gallium indium nitride layer, on the gallium indium nitride layer, for example, a p-type cladding layer configured with a p-type aluminum gallium indium nitride layer having small lattice distortion due to the lattice mismatch and excellent crystallinity can be formed. As a result, a high-voltage group III nitride semiconductor ultraviolet LED with small leakage of an element operation current and high reverse voltage is obtained.

The group III nitride semiconductor light-emitting element according to the present invention is able to have a configuration in which a light-emitting layer is formed by sequentially laminating gallium indium nitride layers sequentially increasing band gaps (forbidden band widths) in the direction of increasing layer thicknesses by using a gallium indium nitride (compositional formula: $Ga_X In_{1-X} N$, $0 \leq X < 1$) layer in which indium composition sequentially reduces toward the direction of extracting light emission to the outside as the light-emitting layer.

As a result, it is possible to produce a group III nitride semiconductor LED capable of efficiently extracting light emission in the direction of extracting light emission corresponding to a direction in which layer thickness of the gallium indium nitride layer is increased.

According to the present invention, for example, it is possible to produce a group III nitride semiconductor LED that presents light emission in a state of band spectrum of a continuing wavelength in the ultraviolet wavelength band. An LED that emits such a continuous spectrum can be applied to an ink dryer or the like for solidifying, for example, ink materials that solidify upon receiving light energy of ultraviolet light, and in particular, for solidifying ink materials having different absorption bands.

According to the present invention, since a width of the continuous spectrum emitted from the light-emitting layer is set at not less than 10 nm as a wavelength, it is possible to provide, for example, a group III nitride semiconductor ultraviolet LED that can be used for an ink dryer or the like solidifying ink materials having different absorption bands as a whole.

DESCRIPTION OF EMBODIMENTS

Figure 1:
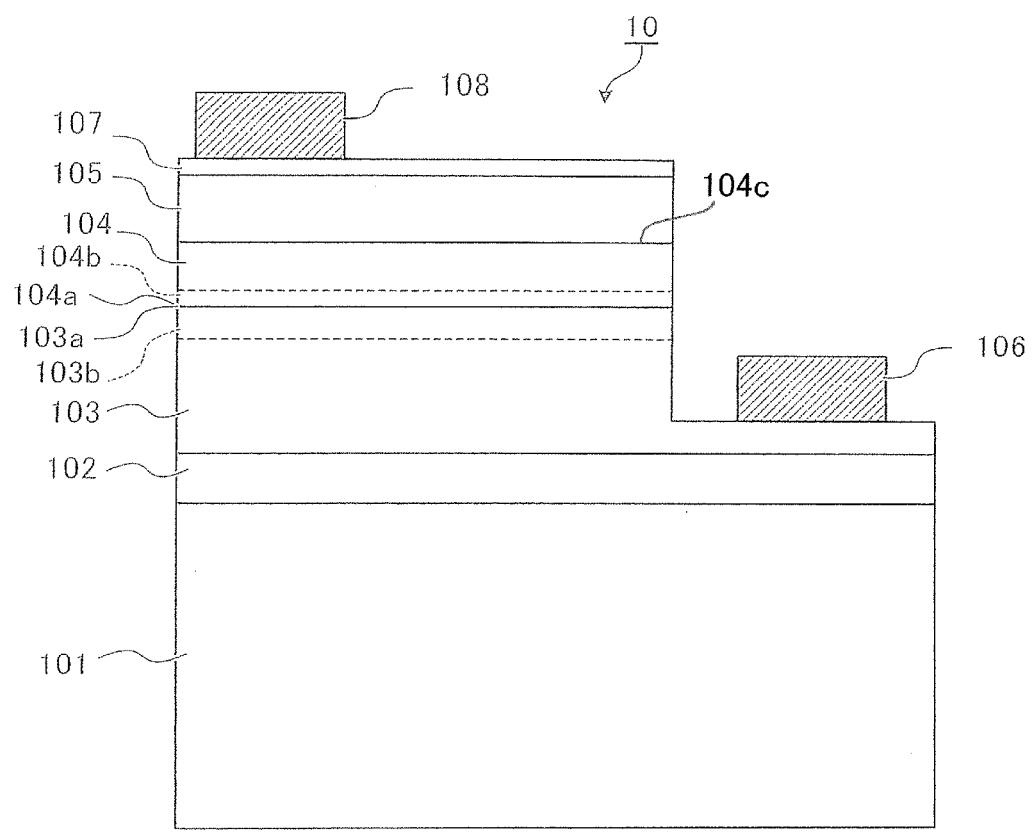
FIG. 1 is a schematic view showing a vertical cross-sectional configuration of an LED chip used in Example 1.

Hereinafter, an exemplary embodiment according to the present invention will be described in detail. It should be noted that the present invention is not limited to the following exemplary embodiment, but may be practiced as various modifications within the scope of the gist thereof. Moreover, each of the figures to be used indicates an example for illustration of the exemplary embodiment, and does not represent an actual size thereof.

A group III nitride semiconductor light-emitting element, to which the exemplary embodiment is applied, is produced by utilizing a laminated body configured with a group III nitride semiconductor formed on a substrate.

As the substrate, a substrate configured with a glass substrate, a metal oxide crystal substrate, such as sapphire ($\alpha$-$Al_2O_3$ single crystal), zinc oxide (ZnO) or the like, with a crystal plane polarized or not polarized as a surface thereof, or semiconductor crystals such as silicon carbide (SiC), silicon (Si), gallium nitride (GaN) or the like of a hexagonal 6H type, hexagonal 4H type or cubic 3C type can be listed for exemplification.

Moreover, not limited to a bulk crystal substrate, for example, a group III nitride semiconductor layer composed of GaN or the like or an epitaxial growth layer configured with a group III-V compound semiconductor, such as a boron phosphide (BP) layer can be used as the substrate.

In the exemplary embodiment, on the substrate, an aluminum gallium indium nitride (compositional formula: $Al_\alpha Ga_\beta In_\gamma N$, $0 \leq \alpha \leq 1$, $0 \leq \beta \leq 1$, $0 \leq \gamma < 1$, $\alpha+\beta+\gamma=1$) layer for constituting a light-emitting element having a pn junction DH (double hetero) structure is formed as a lower cladding layer.

For example, in a case of an LED of p-side up that extracts light emission to the outside from the p-type semiconductor layer side, the lower cladding layer is configured with the aluminum gallium indium nitride layer that indicates conductivity of n-type.

For example, the lower cladding layer is configured with gallium nitride (GaN) of n-type, to which donor impurity composed of an element having atomic radius smaller than that of indium (atomic radius=0.166 nm), such as silicon (atomic radius=0.132 nm), germanium (atomic radius=0.137 nm) or the like. Small atomic radius also means small covalent radius.

In the exemplary embodiment, it is preferable that the layer thickness of the lower cladding layer is several μm to dozen μm. In a case where lattice mismatch in constituent materials between the substrate and the lower cladding layer is large, it is desirable to thicken the lower cladding layer for suppressing propagation of defects in crystals, such as dislocation or the like caused by inconsistency with the substrate, to the light-emitting layer.

On the other hand, in a case where the lower cladding layer is configured with mixed crystals of aluminum indium nitride (compositional formula: $Al_\alpha In_\gamma N$, $0 < \alpha \leq 1$, $0 \leq \gamma < 1$, $\alpha+\gamma=1$) containing indium nitride (InN) having high sublimation property, if the thickness of the lower cladding layer is excessively large, due to sublimation of indium nitride in the course of deposition at high temperature, there is a tendency to have difficulty in obtaining the lower cladding layer with flat surface.

In the exemplary embodiment, in a case where the lower cladding layer is provided on a substrate of different kind, which is composed of a material having a lattice constant different from that of aluminum gallium indium nitride, a buffer layer for increasing consistency between the substrate and the lower cladding layer is inserted between both layers in the vertical direction.

For example, in a case where a silicon single crystal is used as the substrate, between the substrate and the lower cladding layer composed of $Al_\alpha Ga_\beta In_\gamma N$ ($0 \leq \alpha \leq 1$, $0 \leq \beta \leq 1$, $0 \leq \gamma < 1$, $\alpha+\beta+\gamma=1$), a buffer layer configured with an $Al_\alpha Ga_\beta N$ ($0 \leq \alpha \leq 1$, $0 \leq \beta \leq 1$, $\alpha+\beta=1$) layer for relieving lattice mismatch therebetween is inserted, in which a gradient is added to aluminum composition ($\alpha$) (or gallium composition ($\beta$)) in the direction of layer thickness.

Further, between the silicon single crystal substrate and the buffer layer configured with the $Al_\alpha Ga_\beta N$ ($0 \leq \alpha \leq 1$, $0 \leq \beta \leq 1$, $\alpha+\beta=1$) layer, a metal aluminum thin film layer may be inserted.

From the viewpoint of lattice consistency, it is preferable that the surface of the buffer layer that is in contact with the lower cladding layer is configured with a material having a lattice constant same as that of the semiconductor material constituting the lower cladding layer.

For example, in the case where the lower cladding layer is configured with a gallium nitride layer, it is preferable that the metal aluminum thin film layer and a superposition structure layer configured with the $Al_\alpha Ga_\beta N$ ($0 \leq \alpha \leq 1$, $0 \leq \beta \leq 1$, $\alpha+\beta=1$) composition gradient layer provided thereon are assumed to be the buffer layer, and the surface of the $Al_\alpha Ga_\beta N$ ($0 \leq \alpha \leq 1$, $0 \leq \beta \leq 1$, $\alpha+\beta=1$) composition gradient layer is composed of gallium nitride.

In general, the atomic concentration of the donor impurities in the inside of the lower cladding layer is assumed to be substantially constant; however, in the exemplary embodiment, it is preferable to use the group III nitride semiconductor layer, which is formed to have the atomic concentration of silicon or the like, whose atomic radius is smaller than that of indium, to be lower on the surface thereof than in the inside of the layer, as the lower cladding layer. In this case, reduction in lattice of the crystals constituting the surface of the lower cladding layer is suppressed, and incorporation of indium into the gallium indium nitride (compositional formula: $Ga_X In_{1-X} N$, $0 \leq X < 1$) layer provided on the lower cladding layer is accelerated.

Here, the inside of the lower cladding layer means a region whose depth from the surface of the layer exceeds about 120 times of lattice spacing of crystals in the group III nitride semiconductor that constitutes the surface of the layer.

In other words, the surface region of the lower cladding layer is located within the depth from the surface about 120 times of the lattice spacing of crystals constituting the surface. According to a study of the present inventor, it is found that a gallium indium nitride layer, into which indium is readily incorporated, is formed on the surface of the lower cladding layer by reducing atomic concentration of the donor impurities at least in the surface region.

In a case where the lower cladding layer is configured with crystal surfaces of a cubic crystal which has lattice constant "a" represented by {hkl} of Miller indices, the lattice spacing ($d_c$) of crystal surfaces constituting the surface of the lower cladding layer is obtained based on the following expression (1) (Bunn, C. W. (write), Sasada Yoshio (translate), "Kagaku Kesshougaku (Chemical Crystallography)" June 15, Showa 45 (1970), published by Baifukan Co., Ltd., 1st edition, p. 115).

$$d_c = a/(h^2+k^2+l^2)^{1/2} \quad \text{expression (1)}$$

Moreover, in a case where the surface of the lower cladding layer is configured with a crystal surface of a hexagonal crystal, in which the lengths of the a-axis and the c-axis are a and c, respectively, the lattice spacing ($d_H$) is obtained from the following expression (2) (refer to above-described "Chemical Crystallography", p. 118).

$$d_H = a/\{(4/3)(h^2+hk+l^2)+(a/c)^2l^2\}^{1/2} \quad \text{expression (2)}$$

For example, in the case of the lower cladding layer composed of gallium nitride having a wurtzite crystal structure in which a surface thereof is a (0001) crystal surface, the lattice spacing of the C-plane (=(0001) crystal surface) constituting the surface thereof is 0.26 nm. Accordingly, in this case, the depth of 120 times of the lattice spacing (=0.26 nm) is 31.2 nm.

In the exemplary embodiment, it is desirable that the atomic concentration of donor impurities configured with elements that are contained in the above-described surface region of the lower cladding layer and have atomic radius smaller than that of indium is not more than 1/5 of that in the inside region of the lower cladding layer. Specifically, for example, in a case where the atomic concentration of silicon in the inside of the lower cladding layer is $4\times10^{18}$ cm$^{-3}$, it is desirable that the atomic concentration of silicon in the surface of the lower cladding layer is $6\times10^{17}$ cm$^{-3}$.

Further, it is desirable that the atomic concentration of the donor impurities is not more than 1/10 of that in the inside region of the lower cladding layer. Specifically, for example, in the case of the lower cladding layer composed of n-type gallium nitride having the wurtzite crystal structure, to which silicon is added, if the atomic concentration of silicon in the inside region of the layer is $3\times10^{19}$ cm$^{-3}$, it is desirable that the atomic concentration of silicon in the surface region from the depth of 30 nm to the surface of the layer, for example, is not more than $6\times10^{18}$ cm$^{-3}$, and further, more desirably, not more than $3\times10^{18}$ cm$^{-3}$. The atomic concentration of the donor impurities can be measured by analyzing methods such as a secondary ion mass spectrometry (abbreviation: SIMS) or the like.

When the atomic concentration of the donor impurities in the surface region of the lower cladding layer is excessively low, there is a tendency that electrical resistance in the surface region increases. Accordingly, to prevent from becoming large electrical resistance to a forward current that passes through the light-emitting element, usually, the atomic concentration of the donor impurities in the surface region of the lower cladding layer is preferably not less than $8\times10^{16}$ cm$^{-3}$.

Carrier concentration can be measured by a common capacitance-voltage (C-V) method or the like that utilizes a Schottky junction electrode.

As described above, on the lower cladding layer, in which concentration of the donor impurities is reduced in the surface region thereof, the light-emitting layer configured with the n-type gallium indium nitride (compositional formula: $Ga_XIn_{1-X}N$, $0 \leq X < 1$) layer containing the donor impurities is formed. This makes it possible to obtain light emission of high intensity from the n-type gallium indium nitride layer containing donor impurities such as silicon or the like.

The indium composition (=1-X) of the gallium indium nitride layer that forms the light-emitting layer is appropriately selected in accordance with desired light emission wavelength. For example, as described in aforementioned Patent Document 1 (Japanese Examined Patent Application Publication No. 55-3834), the indium composition is determined based on relation between the indium composition and the forbidden band width (the band gap). If the indium composition is excessively small, the forbidden band width of gallium indium nitride becomes larger, and accordingly, light emission of shorter wavelength is obtained. Actual indium composition in the gallium indium nitride layer can be investigated by utilizing a composition analyzing method, such as, for example, electron probe microanalysis (abbreviation: EPMA).

In the exemplary embodiment, in the case where the light-emitting layer is configured with the gallium indium nitride layer that emits short wavelength light, such as ultraviolet light or near-ultraviolet light, and has small indium composition, it is most preferable that the layer thickness of the light-emitting layer is not less than 50 nm and not more than 300 nm. If the layer thickness of the light-emitting layer is provided in the above-described range, it is possible to eliminate a pseudomorphism-like effect caused by difference in a crystal lattice between the light-emitting layer and the lower cladding layer.

In the exemplary embodiment, in particular, on the surface of the lower cladding layer composed of n-type aluminum gallium indium nitride, the atomic concentration of the donor impurities configured with elements having the atomic radius smaller than that of indium is reduced, and the light-emitting layer configured with gallium indium nitride (compositional formula: $Ga_XIn_{1-X}N$, $0 \leq X < 1$) layer is provided on the lower cladding layer, to thereby make it possible to obtain a gallium indium nitride layer having desired indium composition in a proximity region of the junction interface between in the light-emitting layer with the lower cladding layer.

Here, the proximity region of the junction interface (sometimes referred to as "junction region") means an inside region in the light-emitting layer of the order about 30 nm from the junction interface with the lower cladding layer. Conventionally, the proximity region of the junction interface is a region where poor incorporation of indium remarkably occurs.

The above-described effect remarkably appears in particular, for example, in the case where the light-emitting layer is formed by compounds in which an amount of indium is relatively small than that of gallium that provides light emission in ultraviolet wavelength band.

Conventionally, in the case of such a gallium indium nitride layer having small indium composition, usually, the proximity region of the junction interface is substantially constituted by gallium nitride (GaN) because indium is discharged due to reduction of the crystal lattice caused by a pseudomorphism-like phenomenon.

In contrast, in the exemplary embodiment, by applying technical means for suppressing the reduction of the crystal lattice to the lower cladding layer and forming the gallium indium nitride (compositional formula: $Ga_XIn_{1-X}N$, $0 \leq X < 1$) layer on the lower cladding layer, it is possible to obtain a gallium indium nitride layer having predetermined indium composition in the proximity region of the junction interface of the light-emitting layer with the lower cladding layer.

In other words, in the light-emitting layer formed on the lower cladding layer, which is formed by a compound having a lattice constant smaller than that in the crystals contained in the gallium indium nitride layer constituting the light-emitting layer, such as gallium nitride, the atomic concentration of the donor impurities composed of the elements having atomic radius smaller than that of indium is increased from the junction interface between the light-emitting layer and the lower cladding layer toward the surface of the light-emitting layer.

In the exemplary embodiment, it is possible to provide the junction region of the light-emitting layer with the lower cladding layer as a so-called undoped region where donor impurities composed of the elements having atomic radius smaller than that of indium, such as silicon, are not added.

In particular, in a case where other donor impurities remain, and thereby conductivity in the proximity region of the junction interface in the light-emitting layer is ensured and the forward current is not increased, it is preferable that the junction region of the light-emitting layer with the lower cladding layer is the undoped region.

In the exemplary embodiment, in the light-emitting layer formed on the lower cladding layer, an incorporated amount of indium is varied in accordance with the change in the concentration of the donor impurities composed of the elements having atomic radius smaller than that of indium.

Accordingly, by providing concentration gradient so that concentration of donor impurities composed of the elements having atomic radius smaller than that of indium sequentially increases in the direction of increase of the layer thickness of the gallium indium nitride (compositional formula: $Ga_X In_{1-X} N$, $0 \leq X < 1$) layer constituting the light-emitting layer, it is possible to form the light-emitting layer so that the indium composition is sequentially reduced toward the surface of the gallium indium nitride layer. In this case, the light-emitting layer can be formed as a layer in which the forbidden band width is sequentially increased in the direction of increase of the layer thickness of the light-emitting layer.

The concentration gradient of the donor impurities in the light-emitting layer is not particularly limited, and a gradient style, such as a straight-line shape, a curved-line shape, a staircase shape and a combination thereof, is provided.

Specifically, for example, in a case where deposition is performed while a supply rate of gallium and indium to a film-formation reaction system is maintained constant to obtain a gallium indium nitride layer having constant indium composition, there is an advantage that the gallium indium nitride layer in which the indium composition is sequentially reduced toward the surface of the layer is easily formed by simply increasing a supply amount of the donor impurities to a growth reaction system with the passage of time of forming the gallium indium nitride layer.

In this manner, by forming the light-emitting layer so that the forbidden band width is increased toward the surface of the layer and arranging the light-emitting layer so that a layer having the large forbidden band width is located on the surface side than on the lower cladding layer side, light emission can be efficiently extracted to the outside.

In the exemplary embodiment, in the light-emitting layer, it is convenient to form a p-type upper cladding layer that is configured with aluminum gallium nitride or the like having lattice constant smaller than that of the crystals constituting the light-emitting layer and having advantage in extracting light emission to the outside on the light-emitting layer by providing the concentration gradient to the concentration of donor impurities as described above and changing the indium composition to be reduced toward the surface of the light-emitting layer. In other words, by increasing the donor impurities composed of the elements having atomic radius smaller than that of indium and reducing the indium composition, it is possible to form, on the surface region of the light-emitting layer, a crystal layer having small lattice mismatch with a p-type aluminum gallium indium nitride (compositional formula: $Al_\delta Ga_\epsilon In_\zeta N$, $0 \leq \delta \leq 1$, $0 \leq \epsilon \leq 1$, $0 \leq \zeta < 1$, $\delta + \epsilon + \zeta = 1$) layer having a lattice constant smaller than that of the crystals constituting the light-emitting layer.

In the light-emitting layer, to reduce the indium composition in the direction of the layer thickness toward the p-type aluminum gallium indium nitride (compositional formula: $Al_\delta Ga_\epsilon In_\zeta N$, $0 \leq \delta \leq 1$, $0 \leq \epsilon \leq 1$, $0 \leq \zeta < 1$, $\delta + \epsilon + \zeta = 1$) layer, deposition is performed while changing raw material supply amounts of gallium and indium supplied to the deposition environment of the light-emitting layer with passage of time. For example, a method that reduces the supply amount of indium to the deposition environment with passage of time while maintaining the supply amount of gallium constant is provided.

In the light-emitting layer, by changing the donor impurities and the indium composition, for example, exponentially or linearly toward the light-emitting layer composed of gallium indium nitride, band-like continuous spectral light emission is obtained.

The range of wavelength from which the band spectrum is obtained is expanded by increasing concentration gradient of atomic concentration of the donor impurities. Moreover, the range of wavelength from which the band spectrum is obtained is expanded by increasing the changing amount of the indium composition. Moreover, by changing amounts of both of the concentration gradient of donor impurities and the indium composition, band-like light emission can be obtained in wider wavelength range than in the case where one of the donor impurities and the indium composition is changed.

In the exemplary embodiment, the band range from which the band spectrum as light of continuous wavelength can be obtained is not less than 10 nm. Here, "light of continuous wavelength" means light in which light emission wavelengths are close to one another and merged to present a band spectrum that is continued in terms of wavelength as if there are no intervals. Specifically, definition is given as a range in which light with intensity of not less than 80% of the maximum peak is continued.

As a method of forming the gallium indium nitride layer, for example, similar to the n-type or p-type aluminum gallium indium nitride layer, film forming methods such as a chemical vapor deposition (abbreviation: CVD) method, a physical vapor deposition (abbreviation: PVD) method, a metal organic chemical vapor deposition method or metal organic vapor phase epitaxy method (abbreviation: MOCVD or MOVPE) that use trimethylgallium (molecular formula: $(CH_3)_3 Ga$) as a gallium source and trimethylindium (molecular formula: $(CH_3)_3 In$) as an indium source and the like can be provided. In the MOCVD method, a nitrogen-containing compound such as ammonia (molecular formula: $NH_3$) can be utilized as a nitrogen (chemical symbol: N).

In the exemplary embodiment, the indium composition inside the gallium indium nitride layer is adjusted by, for example, changing the ratio of the supply amount of indium to the total amount of gallium and indium supplied to the film-formation reaction system. It is preferable that the larger the indium composition in the gallium indium nitride layer to be formed, the larger the ratio of supply amount of the nitrogen source to the sum total amount of supply amounts of gallium and indium (so-called V/III ratio).

In the exemplary embodiment, as a doping source, the following compounds are provided for example. Examples of the doping source of silicon include: inorganic silicon compound, such as silane (molecular formula: $SiH_4$) and disilane (molecular formula: $Si_2H_6$); organic silicon compound, such as methyl silane (molecular formula: $CH_3SiH_3$); and the like.

Examples of the doping source of germanium include: germane (molecular formula: $GeH_4$) and the like. In the case where the atomic concentration of donor impurities is provided with the concentration gradient in the gallium indium nitride layer or the n-type aluminum gallium indium nitride layer, it is preferable, for example, to change an amount of the doping source supplied to the film-formation reaction system.

In the exemplary embodiment, it is possible to add silicon and germanium together to the light-emitting layer, to thereby form the n-type gallium indium nitride layer. Since the atomic radius of germanium (=0.137 nm) is larger than the atomic radius of silicon (=0.132 nm), and the radius of germanium ion of tetravalent ($Ge^{4+}$) (=0.053 nm) is larger than the radius of silicon ion ($Si^{4+}$) (=0.042 nm), there is more effect in incorporation of indium.

Specifically, for example, an n-type gallium nitride layer in which germanium and silicon are contained together in the light-emitting layer and the atomic concentration of germanium is set higher than that of silicon in a surface region thereof can contribute to obtain a gallium indium nitride layer having high indium composition in a junction region.

In the exemplary embodiment, as the method of forming the gallium indium nitride layer, the n-type aluminum gallium indium layer and the p-type aluminum gallium indium layer, for example, a common high-frequency plasma molecular beam epitaxy (abbreviation: MBE) method and the PVD method such as an ECR (electron cyclotron resonance) high-frequency plasma MBE method are provided.

Further, a solid source MBE method that uses a group III element source and a nitrogen source is provided. As the group III element source, for example, a simple metal such as aluminum, gallium, indium or the like is provided. As the nitrogen source, plasma containing a nitrogen element, such as nitrogen plasma, is provided. As the doping source, a simple metal of high purity silicon or germanium is used.

In a case of an MBE method using nitrogen plasma, nitrogen plasma, which rarely causes light emission originated from second positive molecular series of nitrogen molecules (including the case where no light is emitted), is most suitable as the nitrogen source. Since the nitrogen plasma does not generate nitrogen ion, it is possible to suppress sputtering of members containing tantalum (chemical symbol: Ta), molybdenum (chemical symbol: Mo) or tungsten (chemical symbol: W) constituting a vacuum growth reaction portion, and thereby a growth layer in which a mixing amount of these transition metals is small is obtained.

In the exemplary embodiment, in the case where the lower cladding layer is formed by the MBE method, it is preferable that the n-type aluminum gallium indium nitride layer, in which atomic concentration of donor impurities composed of elements having an atomic radius smaller than that of indium is low in a surface region, is formed by, for example, reducing a flux amount of silicon with passage of time while supplying raw materials of the group III elements.

Specifically, in the case of reducing the flux amount, a temperature of a cell (a crucible) for containing the donor impurities is dropped, and an evaporation amount of the doping source is reduced. The faster the temperature in the cell is dropped and the more sharply the evaporation amount of the doping source is reduced, the more steeply the atomic concentration of the donor impurities is reduced in the direction of increasing the layer thickness of the lower cladding layer.

It should be noted that, in the MOCVD method, it is possible to change the amount of doping source to be added to the film-formation reaction system in the course of forming the surface region in the n-type aluminum gallium indium nitride layer with passage of time.

In the exemplary embodiment, in the case where, in the light-emitting layer configured with the gallium indium nitride layer, the concentration gradient is provided so that the atomic concentration of donor impurities becomes high toward the surface of the light-emitting layer, contrary to the aforementioned forming method of the lower cladding layer, the temperature in the cell for containing the donor impurities is increased with passage of time, and the evaporation amount of the doping source is increased.

In this case, by smoothly increasing the temperature in the cell without any interruption, the atomic concentration of the donor impurities is continuously changed, and as a result, a continuous band spectrum is emitted from the light-emitting layer configured with the gallium indium nitride layer. When the changing amount of flux of the donor impurities is increased, a changing width of the indium composition is also increased, and thereby it is possible to widen the wavelength width of the band spectrum.

In the exemplary embodiment, in forming the light-emitting layer configured with the gallium indium nitride layer, the ratio of the supply amount of indium to the total amount of gallium and indium supplied to the film-formation reaction system is reduced with passage of time from a point in time when formation of the layer is started. This provides the concentration gradient so that the concentration of the indium composition becomes smaller toward the surface of the light-emitting layer. The larger the reduction ratio of the supply ratio of indium with passage of time, the wider the wavelength range of the band spectrum emitted from the gallium indium nitride layer.

Moreover, in forming the light-emitting layer configured with the gallium indium nitride layer, it is possible to provide the concentration gradient so that the concentration of the indium composition becomes smaller toward the surface of the light-emitting layer by increasing the temperature of the substrate with passage of time while maintaining quantitative ratio of gallium and indium supplied to the film-formation reaction system constant. In the film formation by the MOCVD method or the MBE method, it is in common that the larger the temperature rising rate of the substrate, the steeper the change in the indium composition.

In the exemplary embodiment, in the case of changing the supply ratio of the group III elements, or in the case of changing the temperature of the substrate, in the junction region of the light-emitting layer with the lower cladding layer, a ratio or temperature by which a gallium indium nitride layer with the highest indium composition is available is assumed to be a starting point for changing.

Moreover, in the surface region of the light-emitting layer, a ratio or temperature by which a gallium indium nitride layer with the lowest indium composition is available is assumed to be an endpoint of changing.

In the exemplary embodiment, the starting point of changing of the supply ratio of the group III elements or the substrate temperature does not necessarily coincide with the point in time when formation of the gallium indium nitride layer is started. Moreover, the endpoint of changing of the supply ratio of the group III elements or the substrate temperature does not necessarily coincide with the point in time for ending film formation. For example, it can be allowable that, after some time is passed from starting formation of the gallium indium nitride layer, the temperature of the substrate is increased, and rising of substrate temperature is terminated prior to ending the film formation.

By use of a group III nitride semiconductor light-emitting element employing a gallium indium nitride layer as a light-emitting layer, to which the exemplary embodiment is applied, a p-side up LED is configured.

In the case of configuring the p-side up LED, for example, a positive (+) ohmic electrode is provided in electrically contact with an upper cladding layer that is provided on the light-emitting layer and is configured with a p-type aluminum gallium indium nitride. Moreover, a negative (−) ohmic electrode is provided in electrically contact with a lower cladding layer that is provided under the light-emitting layer and is configured with an n-type aluminum gallium indium nitride. In this case, the p-type upper cladding layer and the light emitting layer existing in a region for providing the negative electrode are removed by a dry etching method or the like.

It should be noted that, in the exemplary embodiment, within a scope which does not affect extraction of light emission to the outside, a transparent conductive oxide film or the like may be arranged on the upper cladding layer to provide the positive electrode via the film. As the conductive oxide film or the like, for example, indium tin oxide (abbreviation: ITO) film, indium zinc (chemical symbol: Zn) tin oxide (abbreviation: IZTO) film or the like is provided.

EXAMPLES

Next, the present invention will be described in detail by showing examples and comparative examples; however, the present invention is not limited only to these examples.

Example 1

Hereinafter, by use of FIGS. 1 to 3, the group III nitride semiconductor light-emitting element, to which the exemplary embodiment is applied, will be described. Here, a case of an LED having a pn junction DH structure, in which an n-type gallium nitride layer with silicon having an atomic radius smaller than that of indium added as donor impurities is used as a lower cladding layer and a gallium indium nitride layer provided on the lower cladding layer and provided with a concentration gradient in concentration of atoms of silicon is provided as a light-emitting layer, will be described.

FIG. 1 is a schematic view showing a vertical cross-sectional configuration of an LED chip. FIG. 2 is an SIMS analysis graph showing distribution of atomic concentration of indium and silicon in a depth direction of the inside of the lower cladding layer and the light-emitting layer. In this Example, as shown in the SIMS analysis graph in FIG. 2, a place where the atomic concentration of silicon (Si) reducing toward a surface of the lower cladding layer is turned to increase is a junction interface between the lower cladding layer and the light-emitting layer. FIG. 3 shows a spectrum of light emission from the LED.

On a surface of an antimony (chemical symbol: Sb)-doped n-type (111) silicon (Si) substrate 101, in which a (111) crystal plane is a surface, each layer of a group III nitride semiconductor constituting an LED 10 was grown by a molecular beam epitaxy (MBE) method. As a nitrogen source, nitrogen plasma generated by exciting a nitrogen gas (excitation electrical power=350 W) at high frequency (13.56 MHz) was used. An intensity of a light emission peak owing to second positive molecular series of nitrogen molecules in a wavelength region not less than 250 nm and not more than 370 nm was not more than 1/10 of an intensity of light emission peak of nitrogen in an atomic state with a wavelength of 745 nm. A flow rate of the nitrogen gas was appropriately adjusted within a range of 1.5 cc to 3.0 cc per minute in each layer.

On the (111) crystal plane surface of the above-described Si substrate 101, with an aluminum simple metal as an aluminum source, an aluminum nitride (AlN) layer (the layer thickness=25 nm) 102, which is undoped and of high resistance, was grown with a base temperature of 780° C. A pressure in an MBE growth chamber in growing was set at $4 \times 10^{-3}$ Pa.

Next, on the aluminum nitride layer 102, with a silicon (Si) simple body as a doping source, a lower cladding layer 103 configured with a silicon (Si)-doped n-type gallium nitride (GaN) layer was grown with a temperature of the Si substrate 101 being 750° C. A flux amount of gallium was set at $1.1 \times 10^{-4}$ Pa. For generating nitrogen plasma to grow the lower cladding layer having the layer thickness of 3 μm, the flow rate of the nitrogen gas was set at 3 cc per minute. The pressure in the growth chamber in growing was set at $5 \times 10^{-3}$ Pa.

When the lower cladding layer 103 was grown, a temperature of a cell (crucible) for containing silicon (a silicon cell) was changed, and thereby a concentration gradient was provided so that an atomic concentration of silicon inside the lower cladding layer 103 was reduced toward a junction interface with a light-emitting layer 104. Until 170 minutes were passed from a point in time when the growth of the lower cladding layer on the aluminum nitride layer 102 was started, the temperature of the silicon cell was maintained constant at 1150° C. From a point in time when the layer thickness of the lower cladding layer 103 reached 2.8 μm, the temperature of the silicon cell was reduced at a rate of 20° C. per minute to be 950° C. Consequently, in a region from a surface 103a of the lower cladding layer 103 to reach a depth of 0.2 μm, a surface region 103b, in which an atomic concentration of silicon was gradually reduced, was formed.

The atomic concentration of silicon in the surface 103a of the lower cladding layer was $2 \times 10^{17}$ cm$^{-3}$, which was lower than the atomic concentration in a deep portion by about two digits. The atomic concentration of silicon in the deep portion of the lower cladding layer, which was grown with the temperature of the silicon cell being set at 1150° C., was $2 \times 10^{19}$ cm$^{-3}$. It should be noted that the atomic concentration of silicon was obtained by conversion based on ion strength value of silicon shown in FIG. 2.

A carrier concentration in the deep portion of the lower cladding layer 103 measured by a common C-V method was $4 \times 10^{18}$ cm$^{-3}$, which was substantially constant. In response to a drop in the temperature of the silicon cell, the carrier concentration was gradually and smoothly reduced in the surface region 103b, and the carrier concentration on the surface 103a of the lower cladding layer 103 was $1 \times 10^{17}$ cm$^{-3}$.

An atomic arrangement structure on the surface 103a of the lower cladding layer 103 was investigated by reflective high-energy electron diffraction (RHEED). An RHEED pattern obtained from the surface 103a was a diffraction pattern in streaks indicating that the surface 103a was two-dimensionally smooth. Moreover, a linear diffraction pattern thereof indicated a (2×2) rearrangement structure showing that gallium existed more than nitrogen.

Next, on the lower cladding layer 103, a gallium indium nitride layer (the layer thickness=200 nm) was grown as the light-emitting layer 104. The pressure in the growth chamber in growing was set at $5 \times 10^{-3}$ Pa. The flux amount of gallium was set at $1.1 \times 10^{-4}$ Pa and the flux amount of indium was set at $2.4 \times 10^{-6}$ Pa. These flux amounts were maintained constant during the growth of the light-emitting layer 104. With these flux amounts, in a case where the atomic concentration of silicon was set at $2 \times 10^{17}$ cm$^{-3}$, which was constant, a gallium indium nitride layer with the indium composition of 0.04 (compositional formula: $Ga_{0.96}In_{0.04}N$) was obtained.

When the growth of the light-emitting layer 104 was started, the temperature of the silicon cell was set at 950° C., and as the layer thickness of the gallium indium nitride layer constituting the light-emitting layer 104 was increased, the temperature of the silicon cell was increased to 1150° C. In a forming process of the junction region 104b until the layer thickness of the gallium indium nitride layer reached 30 nm (growth time: 10 minutes), the temperature of the silicon cell was increased at a constant rate of 2.0° C. per minute. Thereafter, until the layer thickness reached 200 nm (growth time: 50 minutes), the temperature of the silicon cell was increased at a constant rate of 3.6° C. per minute.

Figure 2:
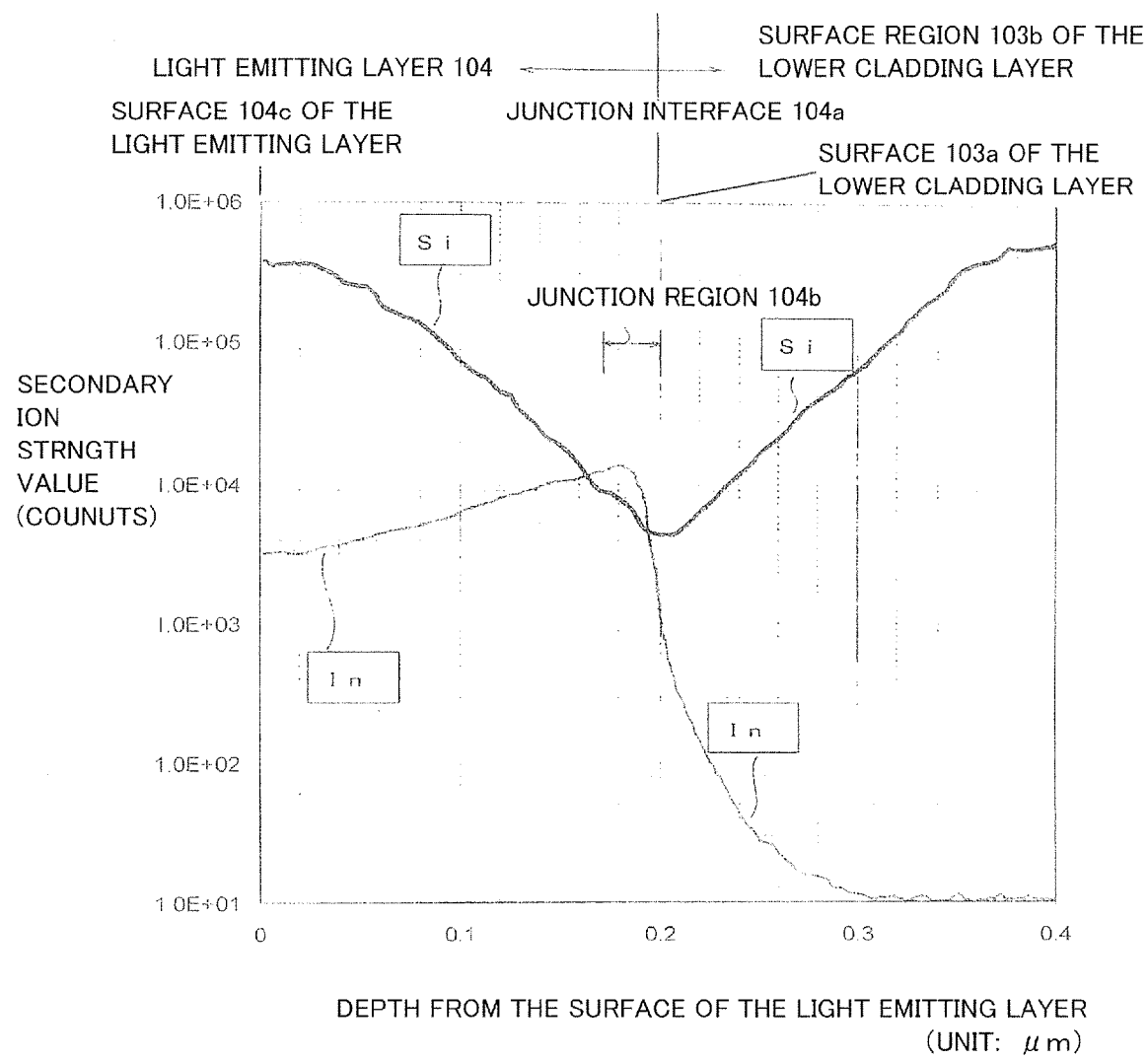
FIG. 2 is an SIMS analysis graph showing distribution of atomic concentration of indium and silicon in a depth direction of an inside of a lower cladding layer and a light-emitting layer in the LED chip used in Example 1.
Figure 3:
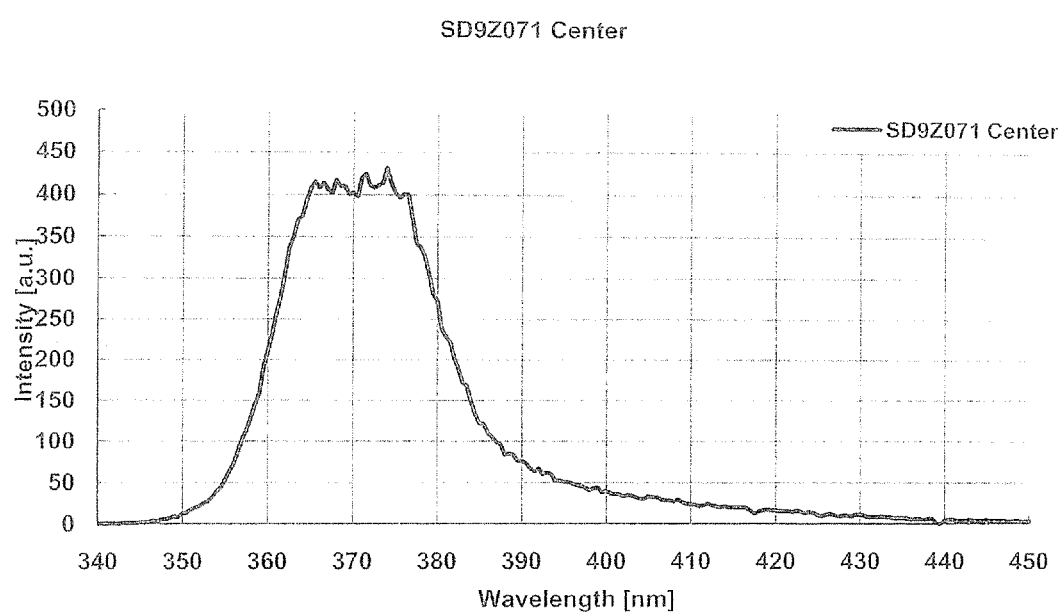
FIG. 3 shows a spectrum of light emission from the LED used in Example 1.

The atomic concentration of silicon at the junction interface 104a with the lower cladding layer 103 was $2\times10^{17}$ cm$^{-3}$, and the atomic concentration of silicon on the surface 104c of the light-emitting layer 104 became $2\times10^{19}$ cm$^{-3}$ (refer to FIG. 2). Moreover, as the added amount of silicon was increased, the indium composition was reduced. The indium composition was 0.04 at the junction interface 104a; however, on the surface 104c, the indium composition was 0.01 due to a discharging effect of indium, which was derived from reduction of the crystal lattice.

On the light-emitting layer 104, a magnesium-doped p-type GaN layer (the layer thickness=90 nm) was provided as an upper cladding layer 105 with the temperature of the Si substrate 101 being set at 520° C., to thereby form a laminated body having the pn junction double hetero structure to be used for the LED 10 shown in FIG. 1. When the upper cladding layer 105 configured with the p-type GaN layer was grown, the MBE method, which employed nitrogen plasma causing no light emission owing to second positive molecular series of nitrogen molecules as a nitrogen source, was utilized. The atomic concentration of magnesium inside the p-type GaN layer was set at $1\times10^{19}$ cm$^{-3}$.

Thereafter, by a common dry etching method, the upper cladding layer 105 configured with the magnesium-doped p-type GaN and the light-emitting layer ($Ga_{0.96}In_{0.04}N$) 104 that existed in a portion to form an n-type ohmic electrode 106 were removed.

On a surface of the lower cladding layer 103 configured with the n-type gallium nitride, which was exposed by removing these layers, the n-type ohmic electrode 106 was formed. On the other hand, on a part of a surface of the upper cladding layer 105, which was configured with the p-type GaN layer, left after the etching, a p-type ohmic electrode 107 configured with an indium zinc tin oxide (IZTO) film and a pad electrode 108 electrically conductive thereto were formed. Thereafter, cutting was carried out for generating individual elements (chips), to thereby provide the LED 10 having a square planar shape in which a length of one side was about 350 μm.

When the forward current was set at 20 milliamperes (unit of a current: mA), the forward voltage became 3.6 volts (unit of a voltage: V). As shown in FIG. 3, light emission indicating a band spectrum in an ultraviolet wavelength band of the wavelength of 365 nm to 377 nm was emitted from the LED 10. The wavelength width, which indicated the band spectrum configured by gathering of light emissions having substantially equal intensities though having slightly different wavelengths from one another, became 12 nm.

Example 2

In this example, description will be given of the LED including a junction region inside the light-emitting layer as an undoped region, in which the donor impurities composed of elements having an atomic radius smaller than that of indium are not added (doping is not performed), for accelerating incorporation of indium in the junction region, and a gallium indium nitride layer whose indium composition is provided with a concentration gradient as the light-emitting layer.

Figure 4:
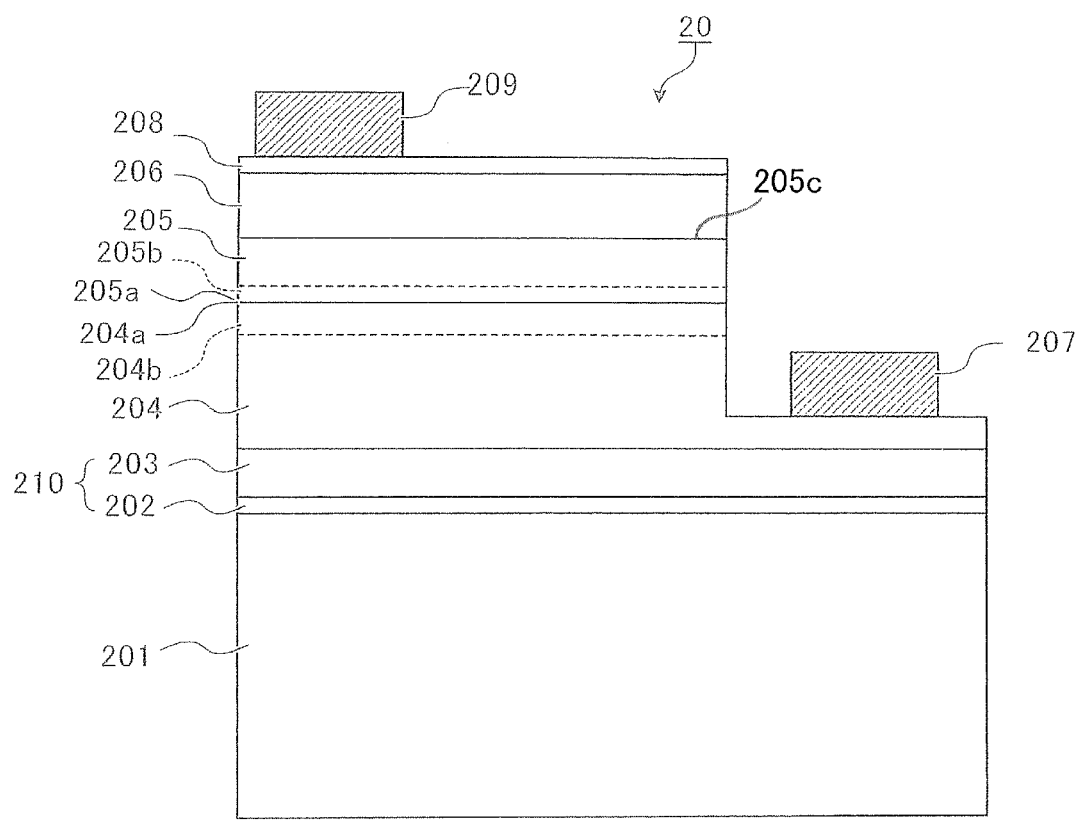
FIG. 4 is a schematic view showing a vertical cross-sectional configuration of an LED chip used in Example 2.
Figure 5:
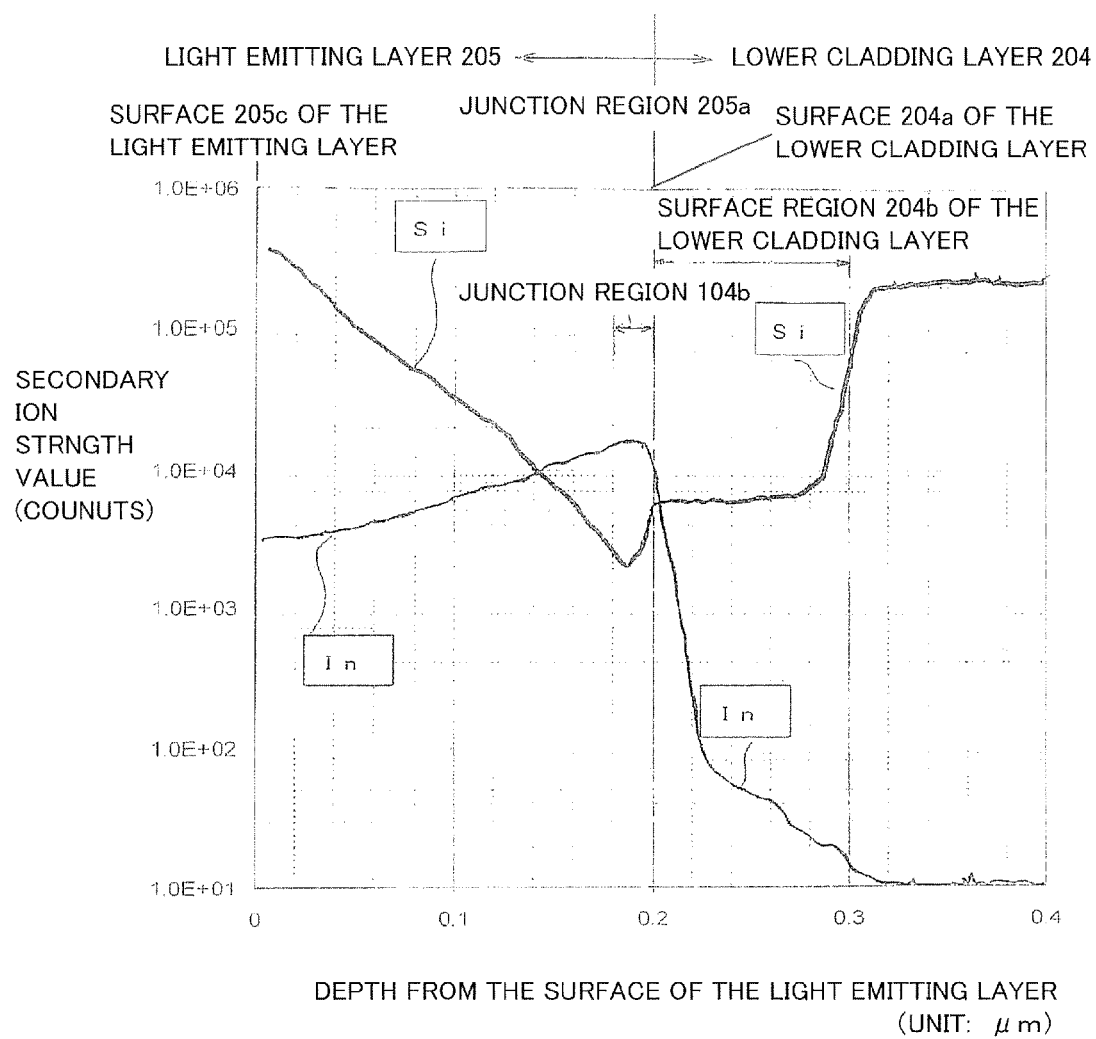
FIG. 5 is an SIMS analysis graph showing distribution of atomic concentration of indium and silicon in a depth direction in the LED chip used in Example 2.
Figure 6:
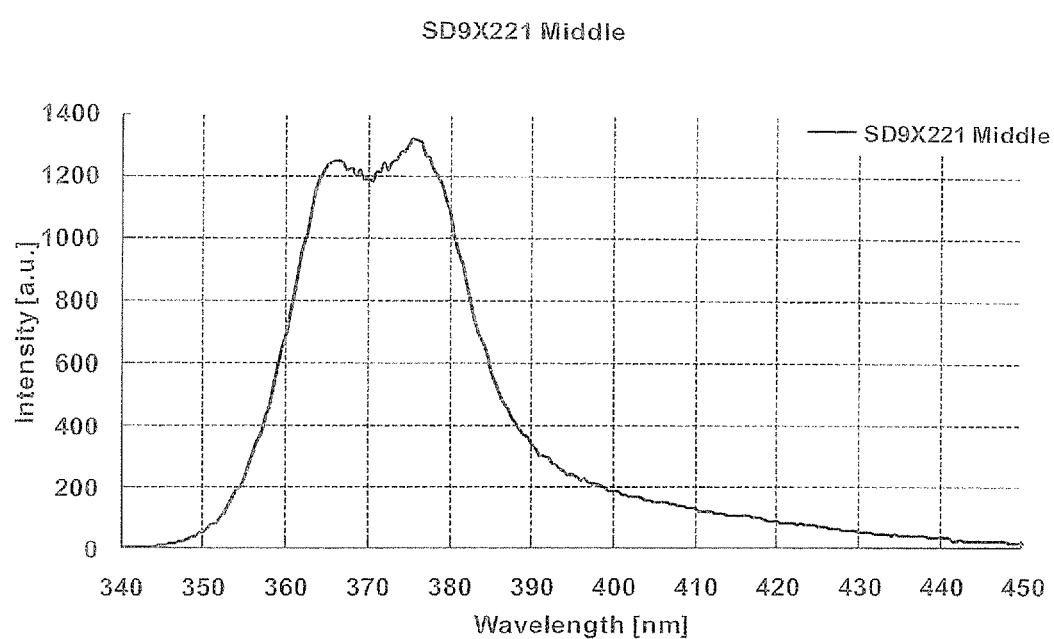
FIG. 6 shows a band spectrum of light emission from the LED used in Example 2.

FIG. 4 is a schematic view showing a vertical cross-sectional configuration of the LED chip used in this example. FIG. 5 is an SIMS analysis graph showing distribution of atomic concentration of indium and silicon in a depth direction inside of the lower cladding layer and the light-emitting layer. FIG. 6 shows a band spectrum of light emission from the LED.

In the laminated body to be used for the LED, boron (chemical symbol: B)-doped p-type silicon (Si), in which crystal plane orientation of a surface is (111), was formed on a substrate 201. After cleaning a surface of the substrate 201 with an inorganic acid, such as hydrofluoric acid (chemical symbol: HF), the laminated body was transported into a growth chamber in an MBE growth device. After transportation, inside of the growth chamber was evacuated to be ultra-high vacuum of $7\times10^{-5}$ Pa. Thereafter, while maintaining the degree of vacuum inside the growth chamber, the temperature of the substrate 201 was increased to 780° C., and was continuously heated until a rearrangement structure of a (7×7) structure was formed on the surface of the substrate 201.

On the surface of the ((111)-silicon) substrate 201, which had been cleaned to be capable of forming the rearrangement structure of the (7×7) structure, an aluminum (Al) film (the layer thickness=5 nm) 202 was formed at 760° C. by an MBE method using nitrogen plasma that was converted into plasma by applying high frequency (=13.56 MHz). A flux amount of aluminum was set at $7.2\times10^{-6}$ Pa. On the aluminum film 202, an undoped aluminum gallium nitride ($Al_XGa_{1-X}N$) composition gradient layer 203 constituting a buffer layer 210, which had a duplex structure with the aluminum film 202, was deposited.

The undoped aluminum gallium nitride ($Al_XGa_{1-X}N$) composition gradient layer 203 (the layer thickness=300 nm) was deposited at 760° C. by the above-described high-frequency nitrogen plasma MBE method. An aluminum (Al) composition ratio (X) in the $Al_XGa_{1-X}N$ composition gradient layer 203 was linearly and continuously reduced from 0.30 to 0 (zero) from the junction surface with the aluminum film 202 toward the surface of the composition gradient layer 203 in proportion to the increase in the layer thickness of the composition gradient layer 203. During the growth of the composition gradient layer 203, the flow rate of a nitrogen gas was set constant at 0.4 cc per minute, and the flux amount of gallium was also set constant at $1.3\times10^{-4}$ Pa.

On the other hand, the flux amount of aluminum was set at $7.2\times10^{-6}$ Pa when the growth of the undoped aluminum gallium nitride ($Al_XGa_{1-X}N$) composition gradient layer 203 was started, and then linearly reduced with passage of the growth time. The growth of the undoped aluminum gallium nitride ($Al_XGa_{1-X}N$) composition gradient layer 203 was terminated by interrupting the flux of gallium and aluminum. The buffer layer having the duplex structure was configured with the undoped aluminum gallium nitride ($Al_XGa_{1-X}N$) composition gradient layer 203 and the aluminum film 202 directly below thereof. Even in the period of interrupting the flux of gallium and aluminum, irradiation of the composition gradient layer 203, whose growth was finished, with the nitrogen plasma was continued.

Next, supply of the flux of gallium was restarted, and deposition of a lower cladding layer 204 configured with silicon-doped n-type gallium nitride (GaN) on the undoped aluminum gallium nitride ($Al_xGa_{1-x}N$) composition gradient layer 203 (X was reduced from 0.3 to 0) was started. The layer thickness of the gallium nitride layer was set at 1500 nm. Only when the growth of the gallium nitride layer was carried out, the nitrogen plasma was generated from two high-frequency nitrogen plasma generating devices attached to a single MBE growth chamber. The flow rate of the nitrogen gas was set at 1.5 cc per minute in each generating device. The flux amount of gallium was set constant at $1.3 \times 10^{-4}$ Pa for 120 minutes, and the growth of the GaN layer was finished. The surface rearrangement structure in the course of the growth of the GaN layer and at the time of finishing thereof was a (2×2) structure indicating that gallium existed more than nitrogen on the surface.

When the GaN layer constituting the lower cladding layer 204 was grown, the temperature of the silicon cell was changed to reduce the atomic concentration of silicon inside the lower cladding layer 204 at a surface region 204b in the proximity of a junction interface with a light-emitting layer 205. From a point in time when the growth of the gallium nitride layer on the undoped aluminum gallium nitride ($Al_xGa_{1-x}N$) composition gradient layer 203 was started until the layer thickness of the gallium nitride layer reached 1400 nm, the temperature of the silicon cell was maintained constant at 1150° C. Thereafter, until the temperature of the silicon cell was decreased to 950° C., supply of the flux of silicon and gallium was suspended. After recognizing that the temperature of the silicon cell was stabilized at 950° C., supply of the flux of silicon and gallium was restarted to form the surface region 204b of the gallium nitride layer until the total layer thickness of gallium nitride reached a predetermined value of 1500 nm.

Consequently, the lower cladding layer 204, in which the atomic concentration of silicon in the surface region 204b in the depth of about 100 nm from the surface was lower than that in the deep portion closer to the undoped aluminum gallium nitride ($Al_xGa_{1-x}N$) composition gradient layer 203, was formed. As a result of the SIMS analysis, the atomic concentration of silicon on the surface 204a of the lower cladding layer 204 was $3 \times 10^{17}$ $cm^{-3}$. The atomic concentration of silicon in the deep portion of the lower cladding layer 204 having been grown at the temperature of the silicon cell being set at 1150° C. was $1 \times 10^{19}$ $cm^{-3}$. Moreover, in the measurement by an electrolytic C-V method, the carrier concentration in the deep portion of the gallium nitride layer was $4 \times 10^{18}$ $cm^{-3}$, and the carrier concentration in the surface region 204b was $1 \times 10^{17}$ $cm^{-3}$.

On the surface 204a of the lower cladding layer 204 composed of the n-type GaN having the (2×2) rearrangement structure, a gallium indium nitride layer constituting the light-emitting layer 205 was formed. The layer thickness of the light-emitting layer 205 was set at 200 nm. Until the layer thickness of the light-emitting layer 205 reached 20 nm, silicon was not added. In other words, a junction region 205b in the proximity of a junction interface 205a with the lower cladding layer 204 was configured as an undoped gallium indium nitride layer. Immediately after formation of the junction region 205b was finished, doping of silicon was started. The temperature of the silicon cell was set at 950° C. at a point in time when silicon doping was started, and then linearly increased so that the temperature reached 1150° C. at a point in time when formation of the light-emitting layer 205 was finished. Accordingly, the light-emitting layer 205, in which the concentration gradient was provided so that the atomic concentration of silicon was $3 \times 10^{17}$ $cm^{-3}$ in the junction region 205b, and $2 \times 10^{19}$ $cm^{-3}$ on the surface 205c, was formed.

In addition to providing a gradient to the atomic concentration of silicon in the light-emitting layer 205, the indium composition in gallium indium nitride constituting the light-emitting layer 205 was also changed. The junction region 205b having a thickness about 20 nm from the junction interface 205a with the lower cladding layer 204 configured with the n-type GaN layer was configured from n-type gallium indium nitride with the indium composition of 0.06 ($Ga_{0.94}In_{0.06}N$). While maintaining the flux amount of gallium constant, the flux amount of indium was relatively reduced so as to continuously form layers having smaller indium compositions in a space from the junction region 205b to the surface 205c. This reduced the indium composition linearly from the junction region 205b to the surface 205c as shown in FIG. 5. The indium composition was constant at 0.06 in the junction region 205b and 0.01 on the surface 205c.

On the light-emitting layer 205 configured with the $Ga_xIn_{1-x}N$ layer, in which a reduction gradient was provided to the indium composition (1-X) (1-X was reduced from 0.06 to 0.01) and an increasing gradient was provided to the atomic concentration of silicon as the donor impurities (the atomic concentration was increased from $3 \times 10^{17}$ $cm^{-3}$ to $2 \times 10^{19}$ $cm^{-3}$), with the substrate temperature being 550° C., a magnesium-doped p-type GaN layer (the layer thickness=100 nm) was provided as an upper cladding layer 206, to thereby form the laminated body having the pn junction double hetero structure to be used for the LED. Also in growing the upper cladding layer 206 configured with the p-type GaN layer, the MBE method, which employed nitrogen plasma causing no light emission owing to second positive molecular series of nitrogen molecules as a nitrogen source, was utilized. The atomic concentration of magnesium inside the p-type GaN layer was $9 \times 10^{18}$ $cm^{-3}$.

Thereafter, by a common dry etching method, the upper cladding layer 206 composed of magnesium-doped p-type GaN and the light-emitting layer 205 composed of $Ga_xIn_{1-x}N$ that existed in a portion to form an n-type ohmic electrode 207 were removed. Further, the surface region 204b of the lower cladding layer 204 with atomic concentration of silicon lower than that in the deep portion was removed, and thereby the deep portion of the lower cladding layer 204 having high atomic concentration of silicon and high carrier concentration was exposed. Thereafter, on the exposed surface of the deep portion of the lower cladding layer 204 composed of n-type gallium nitride, the n-type ohmic electrode 207 was formed. On the other hand, on a part of a surface of the upper cladding layer 206, which was configured with the p-type GaN layer, left after the etching, a p-type ohmic electrode 208 configured with an indium tin oxide (ITO) film and a pad electrode 209 electrically conductive thereto were formed. Part of a bottom portion of the pad electrode 209 (a portion corresponding to a planar area that is about ½ of a bottom area of the pad electrode 209) was provided in contact with the surface of the upper cladding layer 206. Thereafter, cutting was carried out for generating individual elements (chips), to thereby provide an LED 20 having a square planar shape in which a length of one side was about 350 μm.

As shown in FIG. 6, from the LED 20 when a voltage of 3.5V was applied in a forward direction and a forward current of 20 mA was passed, light emission indicating a band spectrum in an ultraviolet wavelength band of the wavelength of 365 nm to 380 nm was emitted. The wavelength width, which indicated the band spectrum configured by gathering of light emissions having substantially equal intensities though having slightly different wavelengths from one another, became 15 nm. Moreover, the intensity of the light emission also became relatively three times as high as the case of Example 1 (refer to FIGS. 3 and 6). It is considered that the widening of the width of light emission spectrum and increasing of the light emission intensity is due to acceleration of incorporation of indium in the junction region 205b by providing the junction region 205b as an undoped region where donor impurities composed of silicon having atomic radius smaller than that of indium are not added.

Comparative Example 1

Here, description will be given of a case where, similar to conventional techniques, a light-emitting layer configured with a gallium indium nitride layer is provided on a lower cladding layer composed of gallium nitride (GaN), in which atomic concentration of silicon is constant in the depth direction, as an example.

An n-type gallium nitride layer, in which atomic concentration of silicon is constant at $2\times10^{19}$ $cm^{-3}$ in the depth direction, was used as a lower cladding layer, and a gallium indium nitride layer was grown on the lower cladding layer by a nitrogen plasma MBE method. During the growth of the gallium indium nitride layer, silicon was continuously added (doping was performed). The temperature of the silicon cell in performing doping was maintained at a constant temperature (1150° C.).

Moreover, with an intention of forming a gallium indium nitride layer having the indium composition of 0.04 ($Ga_{0.96}In_{0.04}N$), the flux amounts of gallium and indium were set at $1.1\times10^{-4}$ Pa and $2.4\times10^{-6}$ Pa, respectively, similar to Example 1 described above. The layer thickness of the gallium indium nitride layer provided as the light-emitting layer was set at 200 nm.

Figure 7:
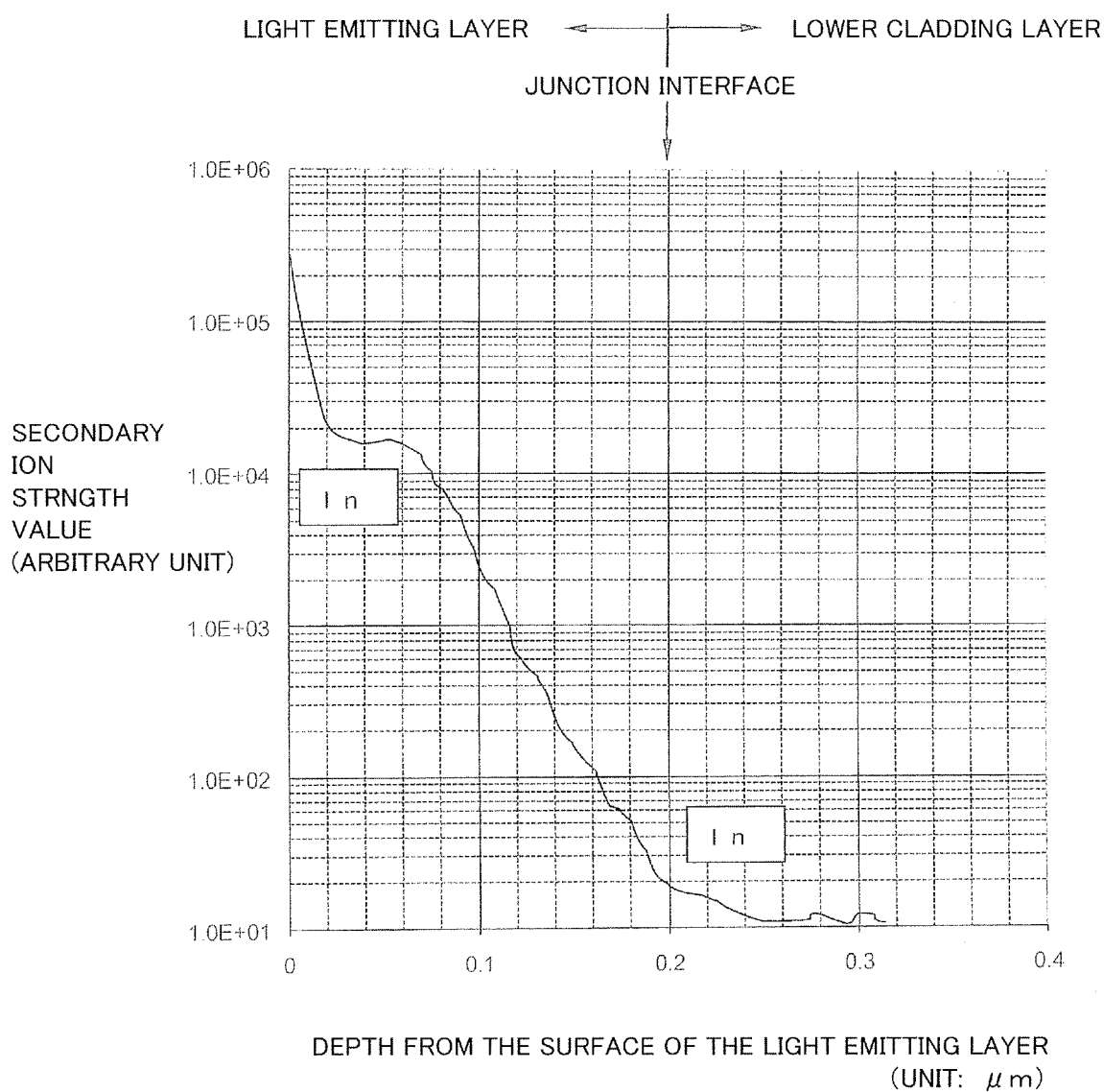
FIG. 7 is an SIMS analysis graph showing concentration distribution of atoms of indium in a depth direction in an LED chip used in Comparative Example 1.

FIG. 7 is an SIMS analysis graph showing distribution of atomic concentration of indium in a depth direction of the inside of the lower cladding layer and the light-emitting layer.

As shown in FIG. 7, the atomic concentration of indium was low in a region in the proximity of a junction interface with the lower cladding layer, and the atomic concentration of indium started to increase at a point far from the junction interface with the lower cladding layer.

A transition distance in terms of concentration required to reach a region where the atomic concentration of indium was substantially constant extended for 130 nm, which corresponded to about ⅔ of the layer thickness of the gallium indium nitride layer. It should be noted that, as shown in FIG. 7, in a region from the surface of the gallium indium nitride layer to the depth of about 20 nm, the number of counts of the measured atomic concentration of indium sharply increases. However, it was determined that this did not mean that concentration of atoms of indium was not actually increased, and was caused by interference in analysis due to oxygen or the like absorbed to the surface of the gallium indium nitride layer.

Moreover, the atomic concentration of silicon in the depth direction in gallium indium nitride layer was constant at $2\times10^{19}$ $cm^{-3}$, though not shown in the figure.

Moreover, in the case where the indium composition is monotonously reduced toward a direction of increasing the layer thickness of the gallium indium nitride layer, there is an advantage in extracting light emission from the surface side to the outside; however, formation of such a gallium indium nitride layer having gradient in the indium composition was not achieved.

Comparative Example 2

Here, description will be given of the case where decrease in an amount of incorporation of indium owing to reduction of a crystal lattice is predicted, and a gallium indium nitride layer having indium composition higher than desired is laminated on a lower cladding layer.

An n-type gallium nitride layer, in which atomic concentration of silicon is constant at $1\times10^{19}$ $cm^{-3}$ in the depth direction, was used as a lower cladding layer, and a gallium indium nitride layer was grown on the lower cladding layer by the MBE method. To form a gallium indium nitride layer containing high indium composition in a junction region with the lower cladding layer, a supply amount (a flux amount) of indium was increased relative to gallium. Here, while, similar to Example 1, setting the flux amount of gallium at $1.1\times10^{-4}$ Pa, the flux amount of indium was set at $4.8\times10^{-6}$ Pa, which was twice.

The flux amount of indium was maintained constant, and the growth of the gallium indium nitride layer, whose layer thickness was set at 200 nm, was finished. It should be noted that, to know an effect caused by formation of the gallium indium nitride layer having high indium composition in the junction region, doping of silicon was not performed during the period of forming the gallium indium nitride layer.

Figure 8:
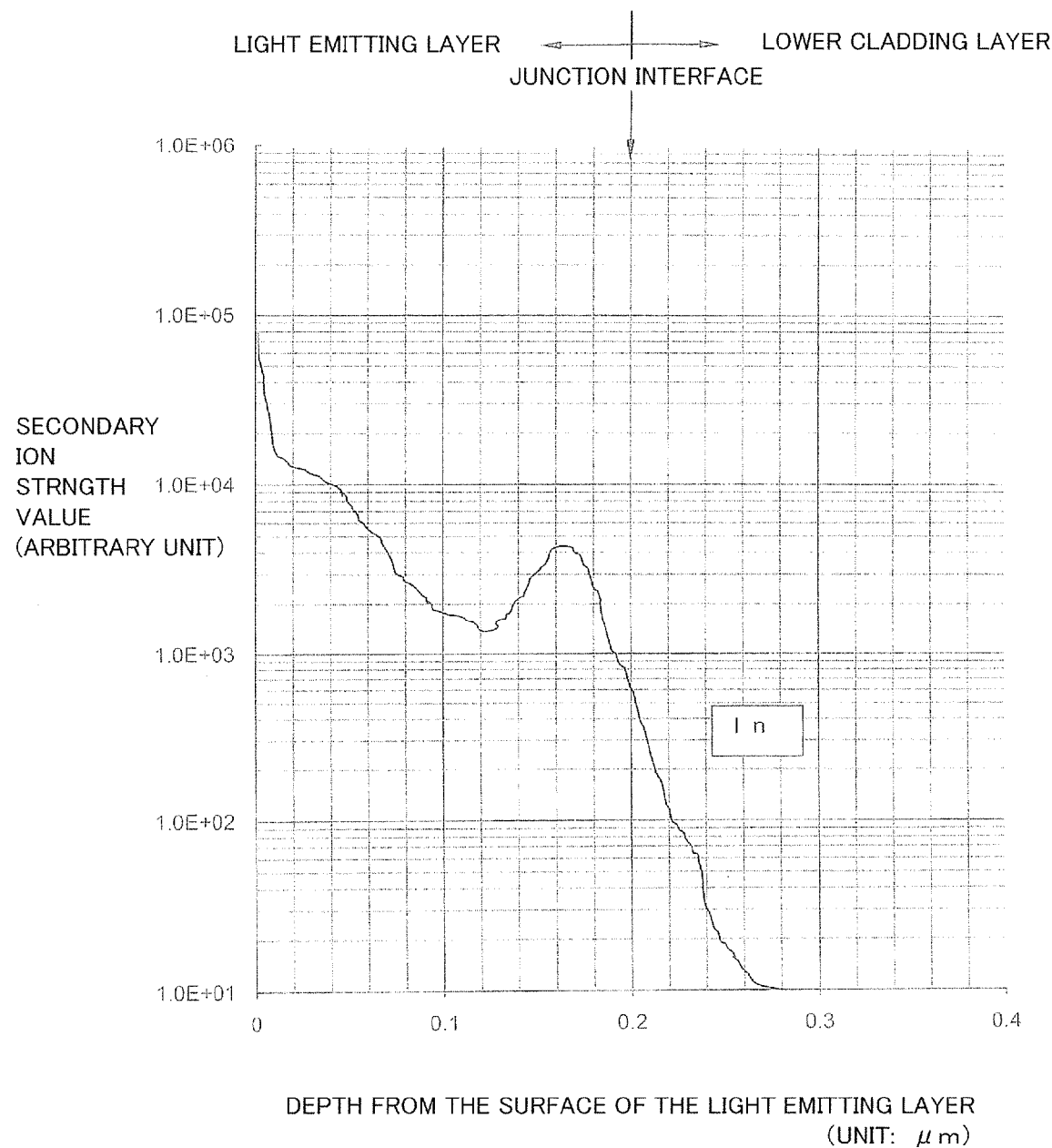
FIG. 8 is an SIMS analysis graph showing concentration distribution of atoms of indium in a depth direction in an LED chip used in Comparative Example 2.

FIG. 8 is an SIMS analysis graph showing distribution of atomic concentration of indium in a depth direction of the inside of the lower cladding layer and the light-emitting layer. As shown in FIG. 8, it can be learned that, in the proximity of the junction interface with the lower cladding layer, a region where the atomic concentration of gallium is low, and conversely, the atomic concentration of indium is high, that is, the indium composition is high is formed. However, though the indium composition was increased, the indium composition remained at about ⅓ of that of Example 1 in spite of the fact that the flux amount of indium was increased twofold compared to the case of Example 1.

As shown in FIG. 8, along with a move away from the junction interface toward the surface, the indium composition is temporarily reduced, but thereafter, turned to increase; accordingly, it can be learned that a gallium indium nitride layer, in which the indium composition is continuously reduced in a direction of increasing the layer thickness, is unavailable. In other words, it can be learned that, since the indium composition is high in the direction of extracting light emission, gallium indium nitride having narrow forbidden band width is arranged, and accordingly, it is impossible to obtain an LED that is excellent in extracting light emission to the outside. It should be noted that, as shown in FIG. 8, in a region from the surface of the gallium indium nitride layer to the depth of about 10 nm, the number of counts of the measured atomic concentration of indium sharply increases; however, it was determined that this did not mean that concentration of atoms of indium was not actually increased, and was caused by interference in analysis due to oxygen or the like absorbed to the surface of the gallium indium nitride layer.

Figure 9:
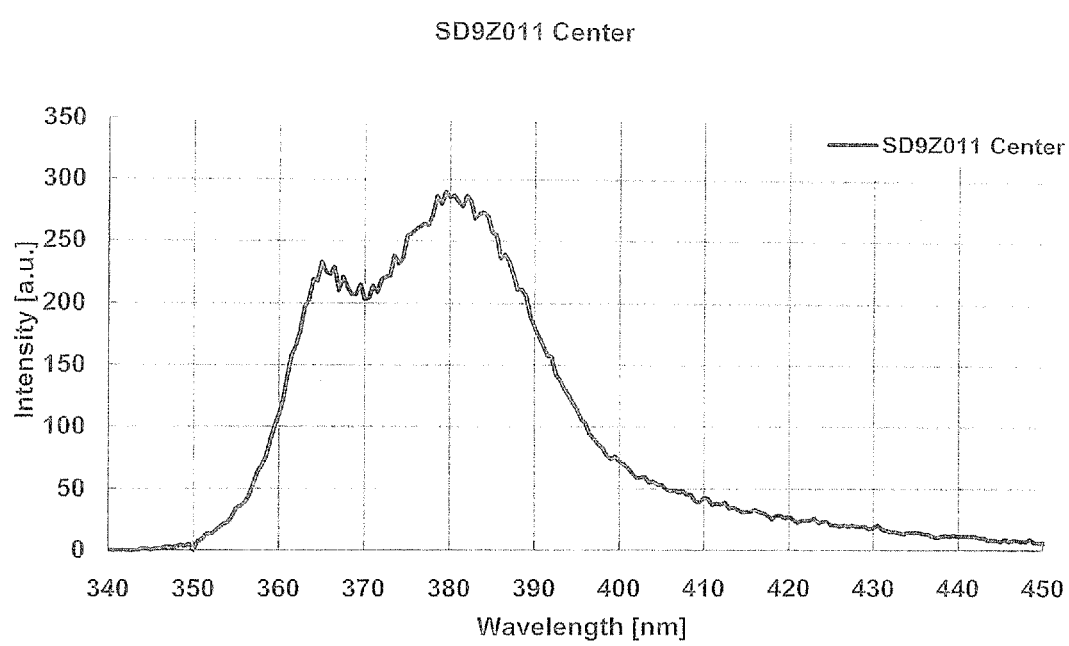
FIG. 9 shows a photoluminescence (PL) spectrum of a light-emitting layer of the LED used in Comparative Example 2.

FIG. 9 shows a photoluminescence (PL) spectrum of the light-emitting layer. As shown in FIG. 9, it can be learned that the intensity of luminescent light excited by helium (chemical symbol: He)-cadmium (chemical symbol: Cd) laser light of a short wavelength (the wavelength=325 nm) is generally small compared to the case of Example 1. Moreover, as shown in FIG. 9, because of inflective concentration distribution of atoms of indium in the layer thickness direction, it was impossible to obtain a band spectrum generated as a result of light emission having a wide range of wavelength and substantially equal intensity.

INDUSTRIAL APPLICABILITY

The gallium indium nitride layer that provides the concentration gradient to the indium composition or atomic concentration of donor impurities composed of elements having an atomic radius smaller than that of indium, and thereby exerts a function to emit lights having different wavelengths simultaneously by utilizing the concentration gradient and to provide a band light-emission spectrum can be used as a functional layer that absorbs plural lights having different wavelengths. Accordingly, the gallium indium nitride layer included in the group III nitride semiconductor light-emitting element according to the present invention can be used as a light-absorbing layer (a light-receiving layer) for photoelectric conversion that efficiently absorbs not only light of single wavelength, but also plural lights having different wavelengths, and for example, there is an advantage in constituting a light-receiving element or a solar cell.

REFERENCE SIGNS LIST 10, 20 ... LED
101 ... Silicon (Si) substrate
102 ... Aluminum nitride layer
103, 204 ... Lower cladding layer
103a, 204a ... Surface
103b, 204b ... Surface region
104, 205 ... Light-emitting layer
104a, 205a ... Junction interface
104b, 205b ... Junction region
104c, 205c ... Surface
105, 206 ... Upper cladding layer
106, 207 ... N-type ohmic electrode
107, 208 ... P-type ohmic electrode
108, 209 ... Pad electrode
201 ... Substrate
202 ... Aluminum film
203 ... Undoped aluminum gallium nitride ($Al_XGa_{1-X}N$) composition gradient layer
210 ... Buffer layer

The invention claimed is:

1. A group III nitride semiconductor light-emitting element having a pn junction hetero structure, comprising:
    an n-type aluminum gallium indium nitride layer;
    a light-emitting layer configured with a gallium indium nitride layer that is arranged in contact with the n-type aluminum gallium indium nitride layer and contains a crystal having a lattice constant larger than that of the n-type aluminum gallium indium nitride layer; and
    a p-type aluminum gallium indium nitride layer that is provided on the light-emitting layer, wherein
    an atomic concentration of a donor impurity existing in the n-type aluminum gallium indium nitride layer and composed of an element having an atomic radius smaller than that of indium is lower at an interface between the n-type aluminum gallium indium nitride layer and the light-emitting layer than in an inside of the n-type aluminum gallium indium nitride layer, and
    an atomic concentration of the donor impurity in the light-emitting layer is higher at an interface between the light-emitting layer and the p-type aluminum gallium indium nitride layer than at the interface between the light-emitting layer and the n-type aluminum gallium indium nitride layer.

2. The group III nitride semiconductor light-emitting element according to claim 1, wherein the light-emitting layer is composed of a gallium indium nitride in which the atomic concentration of the donor impurity is increased from the n-type aluminum gallium indium nitride layer toward the p-type aluminum gallium indium nitride layer.

3. The group III nitride semiconductor light-emitting element according to claim 1, wherein indium composition in the light-emitting layer is lower at the interface between the p-type aluminum gallium indium nitride layer and the light-emitting layer than at the interface between the n-type aluminum gallium indium nitride layer and the light-emitting layer.

4. The group III nitride semiconductor light-emitting element according to claim 1, wherein a junction region with the n-type aluminum gallium indium nitride layer is an undoped region where the donor impurity is not added, the junction region existing inside the light-emitting layer.

5. The group III nitride semiconductor light-emitting element according to claim 4, wherein
    the n-type aluminum gallium indium nitride layer is provided on a buffer layer deposited on a substrate that has no lattice matching with aluminum gallium indium nitride, and
    the buffer layer has a duplex structure of an aluminum (Al) thin film layer and an aluminum gallium nitride layer that is provided on the thin film layer and provides a gradient to aluminum composition.

6. The group III nitride semiconductor light-emitting element according to claim 1, wherein the light-emitting layer is configured with a gallium indium nitride layer that emits light having continuous wavelength with a width of not less than 10 nm.

7. The group III nitride semiconductor light-emitting element according to claim 6, wherein the light-emitting layer is configured with the gallium indium nitride layer that emits light having continuous wavelength within a range of not less than 360 nm and not more than 420 nm.

8. A method for producing the group III nitride semiconductor light-emitting element having a pn junction hetero structure as claimed in claim 1, wherein
    the group III nitride semiconductor light-emitting element comprises:
    the n-type aluminum gallium indium nitride layer;
    the light-emitting layer configured with the gallium indium nitride layer that is arranged in contact with the n-type aluminum gallium indium nitride layer and contains crystal having a lattice constant larger than that of the n-type aluminum gallium indium nitride layer; and
    the p-type aluminum gallium indium nitride layer that is provided on the light-emitting layer, wherein
    the atomic concentration of the donor impurity existing in the n-type aluminum gallium indium nitride layer and composed of an element having an atomic radius smaller than that of indium is lower at an interface between the n-type aluminum gallium indium nitride layer and the light-emitting layer than in an inside of the n-type aluminum gallium indium nitride layer, and
    the atomic concentration of the donor impurity in the light-emitting layer is higher at an interface between the light-emitting layer and the p-type aluminum gallium indium nitride layer than at the interface between the light-emitting layer and the n-type aluminum gallium indium nitride layer,
    the method comprising:
    in forming the light-emitting layer, increasing the atomic concentration of the donor impurity to be added to an inside of the light-emitting layer with passage of time.

9. The method for producing a group III nitride semiconductor light-emitting element according to claim 8, wherein the light-emitting layer is formed by, while maintaining supply amounts of gallium (Ga) and indium (In) to a formation environment constant, increasing the atomic concentration of the donor impurity with passage of time.

10. The method for producing a group III nitride semiconductor light-emitting element according to claim 8, wherein the light-emitting layer is formed by, while maintaining a supply amount of gallium (Ga) to a formation environment constant, reducing a supply amount of indium (In) with passage of time.

11. The method for producing a group III nitride semiconductor light-emitting element according to claim 8, wherein, after a region in the light-emitting layer which joins with the n-type aluminum gallium indium nitride layer is formed as an undoped region where the donor impurity is not added, the light-emitting layer is formed while increasing the atomic concentration of the donor impurity to be added to an inside of the light-emitting layer with passage of time.

12. A group III nitride semiconductor light-emitting element having a pn junction hetero structure, comprising:
   an n-type aluminum gallium indium nitride layer;
   a light-emitting layer configured with a gallium indium nitride layer that is arranged in contact with the n-type aluminum gallium indium nitride layer and contains a crystal having a lattice constant larger than that of the n-type aluminum gallium indium nitride layer; and
   a p-type aluminum gallium indium nitride layer that is provided on the light-emitting layer, wherein
   an atomic concentration of a donor impurity existing in the n-type aluminum gallium indium nitride layer and composed of an element having an atomic radius smaller than that of indium is lower at an interface between the n-type aluminum gallium indium nitride layer and the light-emitting layer than in an inside of the n-type aluminum gallium indium nitride layer,
   an atomic concentration of the donor impurity in the light-emitting layer is higher at an interface between the light-emitting layer and the p-type aluminum gallium indium nitride layer than at the interface between the light-emitting layer and the n-type aluminum gallium indium nitride layer,
   indium composition in the light-emitting layer is lower at the interface between the p-type aluminum gallium indium nitride layer and the light-emitting layer than at the interface between the n-type aluminum gallium indium nitride layer and the light-emitting layer, and
   the indium composition in the light-emitting layer decreases toward the interface between the p-type aluminum gallium indium nitride layer and the light-emitting layer.

* * * * *